(12) United States Patent
Ki et al.

(10) Patent No.: US 12,419,149 B2
(45) Date of Patent: Sep. 16, 2025

(54) CIRCUIT BOARD HAVING MULTIPLE SOLDER RESISTS AND DISPLAYING APPARATUS HAVING THE SAME

(71) Applicant: SEOUL SEMICONDUCTOR CO., LTD., Gyeonggi-do (KR)

(72) Inventors: Youngsik Ki, Gyeonggi-do (KR); Seung Sik Hong, Gyeonggi-do (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 742 days.

(21) Appl. No.: 17/684,970

(22) Filed: Mar. 2, 2022

(65) Prior Publication Data
US 2022/0285599 A1 Sep. 8, 2022

Related U.S. Application Data

(60) Provisional application No. 63/310,367, filed on Feb. 15, 2022, provisional application No. 63/157,180, filed on Mar. 5, 2021.

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC ... H01L 33/62; H01L 25/075; H01L 25/0753; H01L 25/0756; H01L 25/167; H10K 59/60
See application file for complete search history.

(56) References Cited

U.S. PATENT DOCUMENTS

| | | | |
|---|---|---|---|
| 9,953,939 B2* | 4/2018 | Lin | H01L 24/11 |
| 10,903,179 B2* | 1/2021 | Lin | H01L 24/05 |
| 10,964,674 B2* | 3/2021 | Bang | H01L 33/502 |
| 11,219,128 B2* | 1/2022 | Tanaka | H05K 3/4682 |
| 11,404,616 B2* | 8/2022 | Min | H01L 24/83 |
| 11,658,162 B2* | 5/2023 | Lee | H01L 33/62 257/72 |
| 11,823,993 B2* | 11/2023 | Muroga | H01L 23/49866 |

(Continued)

FOREIGN PATENT DOCUMENTS

| | | |
|---|---|---|
| CN | 109962080 A | 7/2019 |
| KR | 1020170007935 A | 1/2017 |

(Continued)

OTHER PUBLICATIONS

International Search Report issued in corresponding International Application No. PCT/KR2022/003029, mailed Jun. 24, 2022, 4 pages.

(Continued)

*Primary Examiner* — Eduardo A Rodela
(74) *Attorney, Agent, or Firm* — Perkins Coie LLP

(57) ABSTRACT

A circuit board includes a base having a plurality of interconnections on an upper surface thereof, a first photosensitive solder resist (PSR) covering the interconnections and defining a pad open region exposing portions of the interconnections, a second PSR covering the first PSR and having an opening exposing the pad open region. The opening of the second PSR is larger than the pad open region of the first PSR.

19 Claims, 14 Drawing Sheets

(56) References Cited

U.S. PATENT DOCUMENTS

| | | | |
|---|---|---|---|
| 2009/0078955 A1* | 3/2009 | Fan | H01L 27/15 |
| | | | 438/46 |
| 2011/0045642 A1 | 2/2011 | Hizume et al. | |
| 2014/0117533 A1* | 5/2014 | Lei | H01L 24/05 |
| | | | 257/E21.59 |
| 2017/0025075 A1* | 1/2017 | Cok | G09G 3/2003 |
| 2017/0288093 A1* | 10/2017 | Cha | H01L 33/382 |
| 2019/0164944 A1 | 5/2019 | Chae et al. | |
| 2022/0367334 A1* | 11/2022 | Huang | H01L 23/49838 |

FOREIGN PATENT DOCUMENTS

| | | |
|---|---|---|
| KR | 1020190006430 A | 1/2019 |
| KR | 1020200087169 A | 7/2020 |
| KR | 102149426 B1 | 8/2020 |

OTHER PUBLICATIONS

European Search Report from related corresponding European Application No. 22763615, dated Feb. 10, 2025.

\* cited by examiner

CIRCUIT BOARD HAVING MULTIPLE SOLDER RESISTS AND DISPLAYING APPARATUS HAVING THE SAME

CROSS-REFERENCE OF RELATED APPLICATIONS AND PRIORITY

The present application is a nonprovisional application which claims priority to and benefit of U.S. Provisional Applications Nos. 63/157,180 filed Mar. 5, 2021 and 63/310,367 filed Feb. 15, 2022, the disclosure of which are incorporated by reference in their entirety as if they are fully set forth herein.

TECHNICAL FIELD

Exemplary embodiments relate to a micro LED displaying apparatus, and a circuit board for mounting micro LEDs and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response, than conventional light sources, and thus, the light emitting diodes have been replacing the conventional light sources.

The conventional light emitting diodes have been generally used as backlight light sources in displaying apparatuses. However, displaying apparatuses that directly realize images using the light emitting diodes have been recently developed. Such displays are also referred to as micro LED displays.

Micro LED displays can realize images of various colors by driving micro LEDs mounted on a circuit board. In general, the micro LED display includes a plurality of pixels in order to realize various images, each including sub-pixels corresponding to one of blue, green, and red light. As such, a color of a certain pixel is typically determined based on the colors of the sub-pixels, so that images can be realized through the combination of such pixels.

Meanwhile, a dark color such as black is realized by turning off micro LEDs, and may be affected by a color of an upper surface of the circuit board observed from a screen side. In particular, when interconnections formed on the circuit board are observed, it is difficult to display desirable black color.

The interconnections formed on the circuit board are generally covered with a solder resist such as a photosensitive solder resist (PSR), and, as a thickness of the PSR becomes thinner, the interconnections are easily observed. Meanwhile, it is possible to prevent the interconnections from being observed by forming a thick PSR covering the interconnections. However, when the PSR is formed thick, patterning for exposing pads of the circuit board is difficult, and an open region is not clearly defined. A pad open region on the circuit board is used as an arrangement mark to arrange the micro LEDs. However, if the pad open region on the circuit board is not clearly defined, it is difficult to accurately arrange the micro LEDs to the pad open region, and thus, a bonding failure is likely to occur.

SUMMARY

Exemplary embodiments provide a circuit board capable of clearly defining a pad open region and preventing interconnections from being observed, and a displaying apparatus having the same.

A circuit board according to one or more exemplary embodiments of the present disclosure includes a base having a plurality of interconnections on an upper surface thereof, a first photosensitive solder resist (PSR) covering the interconnections, and defining a pad open region exposing portions of the interconnections, a second PSR covering the first PSR, and having an opening exposing the pad open region, in which the opening of the second PSR is larger than the pad open region of the first PSR.

A displaying apparatus according to one or more exemplary embodiments of the present disclosure includes, a circuit board, a unit pixel disposed on the circuit board, and a molding member covering the unit pixels, in which the circuit board includes a base having a plurality of interconnections on an upper surface thereof, a first photosensitive solder resist (PSR) covering the interconnections, and defining a pad open region exposing portions of the interconnections, and a second PSR covering the first PSR and having an opening exposing the pad open region, in which the opening of the second PSR is larger than the pad open region of the first PSR, and the unit pixel is disposed in the pad open region.

A pixel module according to one or more exemplary embodiments of the present disclosure includes a circuit board, a unit pixel disposed on the circuit board, and a molding member covering the unit pixels, in which the circuit board includes: a base having a plurality of interconnections on an upper surface thereof, a first photosensitive solder resist (PSR) covering the interconnections and defining a pad open region exposing portions of the interconnections, and a second PSR covering the first PSR, and having an opening exposing the pad open region, in which the opening of the second PSR is larger than the pad open region of the first PSR, and the unit pixel is disposed in the pad open region.

According to one or more embodiments of the present disclosure, a circuit board includes a base, a plurality of interconnections disposed on an upper surface of the base, each interconnection comprising a plurality of portions, a first photosensitive solder resist (PSR) and a second PSR. The first PSR covers a portion of each of the plurality of interconnections, and the first PSR is arranged to define a pad open region configured to expose a remainder portion of each of the plurality of interconnection. The second PSR covers the first PSR and has an opening configured to expose the pad open region. The opening of the second PSR is larger than the pad open region of the first PSR.

In at least one variant, the second PSR is thicker than the first PSR.

In another variant, the first PSR has a thickness of about 10 μm to about 15 μm, and the second PSR has a thickness of about 20 μm to about 25 μm.

In another variant, the plurality of interconnections includes four interconnections disposed on the upper surface of the base and the first PSR covers the portion of each of the four interconnections. The pad open region is further configured to expose the remainder portion of each of the four interconnections.

In another variant, each of the plurality of interconnections includes a first portion located in the pad open region. A second portion is located in the opening of the second PSR and covered with the first PSR, and a third portion is covered with both the first PSR and second PSR. The remainder portion of each of the plurality of interconnections corresponds to the first portion and the portion of each of the plurality of interconnections, covered by the first PSR, correspond to the second portion and the third portion.

In another variant, the circuit board is a printed circuit board.

According to one or more embodiments of the present disclosure, a displaying apparatus includes a circuit board, a unit pixel disposed on the circuit board, and a molding member covering the unit pixel. The circuit board includes a base having a plurality of interconnections on an upper surface thereof, a first photosensitive solder resist (PSR) and a second PSR. The first PSR covers a portion of each of the plurality of interconnection. The first PSR is arranged to define a pad open region configured to expose a remainder portion of each of the plurality of interconnections. The second PSR covers the first PSR and has an opening configured to expose the pad open region. The opening of the second PSR is larger than the pad open region of the first PSR. The unit pixel is disposed in the pad open region and in the opening of the second PSR such that the unit pixel is electrically coupled to the remainder portion of each of the plurality of interconnections in the pad open region.

In at least one variant, the unit pixel includes at least three light emitting devices disposed adjacent to one another.

In another variant, the unit pixel includes a plurality of light emitting stacks stacked one above another. A plurality of connection electrodes is electrically connected to the plurality of light emitting stacks.

In another variant, the unit pixel is arranged to cover the pad open region.

In another variant, the molding member includes a light absorbing material.

In another variant, the displaying apparatus further includes a display panel and a pixel module disposed on the display panel. The pixel module includes the circuit board and a plurality of unit pixels.

According to one or more embodiments of the present disclosure, a displaying apparatus includes a panel substrate and a plurality of pixel modules arranged on the panel substrate. Each pixel module includes a circuit board, a plurality of unit pixels disposed on the circuit board and including a selected unit pixel and a molding member covering the plurality of unit pixels. The circuit board further includes a base having a plurality of interconnections on an upper surface thereof. An interconnection of the plurality of interconnections includes a first part, a second part, and a third part. The circuit board further includes a pad open region formed in a first photosensitive solder resist (PSR) layer and an opening. The pad open region is configured to expose the first part of the interconnection. The first PSR layer covers the second part and the third part of the interconnection. The opening is formed in a second PSR layer covering a portion of the first PSR layer, and the pad open region is exposed in the opening of the second PSR layer. The selected unit pixel is disposed in the opening such that the selected unit pixel is electrically connected to the first part of the interconnection in the pad open region.

In at least one variant, the selected unit pixel covers the pad open region upon being mounted in the opening.

In another variant, the first part of the interconnection is located in the pad open region, the second part located in the opening of the second PSR layer and covered with the first PSR layer, and the third part covered with both the first PSR layer and the second PSR layer.

In another variant, the selected unit pixel further includes a plurality of light emitting stacks stacked one above another on a substrate, and a plurality of connection electrodes electrically connected to the plurality of light emitting stacks.

In another variant, the plurality of light emitting stacks is operable to emit light of different peak wavelengths from one another. One of the plurality of light emitting stacks, farther from the substrate, emits light of a longer wavelength than another light emitting stack near the substrate.

In another variant, an emission area of each of the plurality of light emitting stacks increases as a distance to the substrate decreases.

In another variant, the selected unit pixel further includes a plurality of connection electrodes which is electrically connected to the first part of the interconnection via a bonding material. The bonding material is disposed in the pad open region.

In another variant, a portion of the first PSR layer exposed in the opening vertically overlaps with the selected unit pixel. At least portions of side surfaces of the selected unit pixel are located inside the opening of the second PSR layer such that when the selected unit pixel moves in a lateral direction while the selected unit pixel is mounted, a side surface of the selected unit pixel contacts a side wall of the opening of the second PSR layer, thereby preventing the selected unit pixel from being deviated from the opening.

DETAILED DESCRIPTION OF THE ILLUSTRATED EMBODIMENTS

Figure 1:
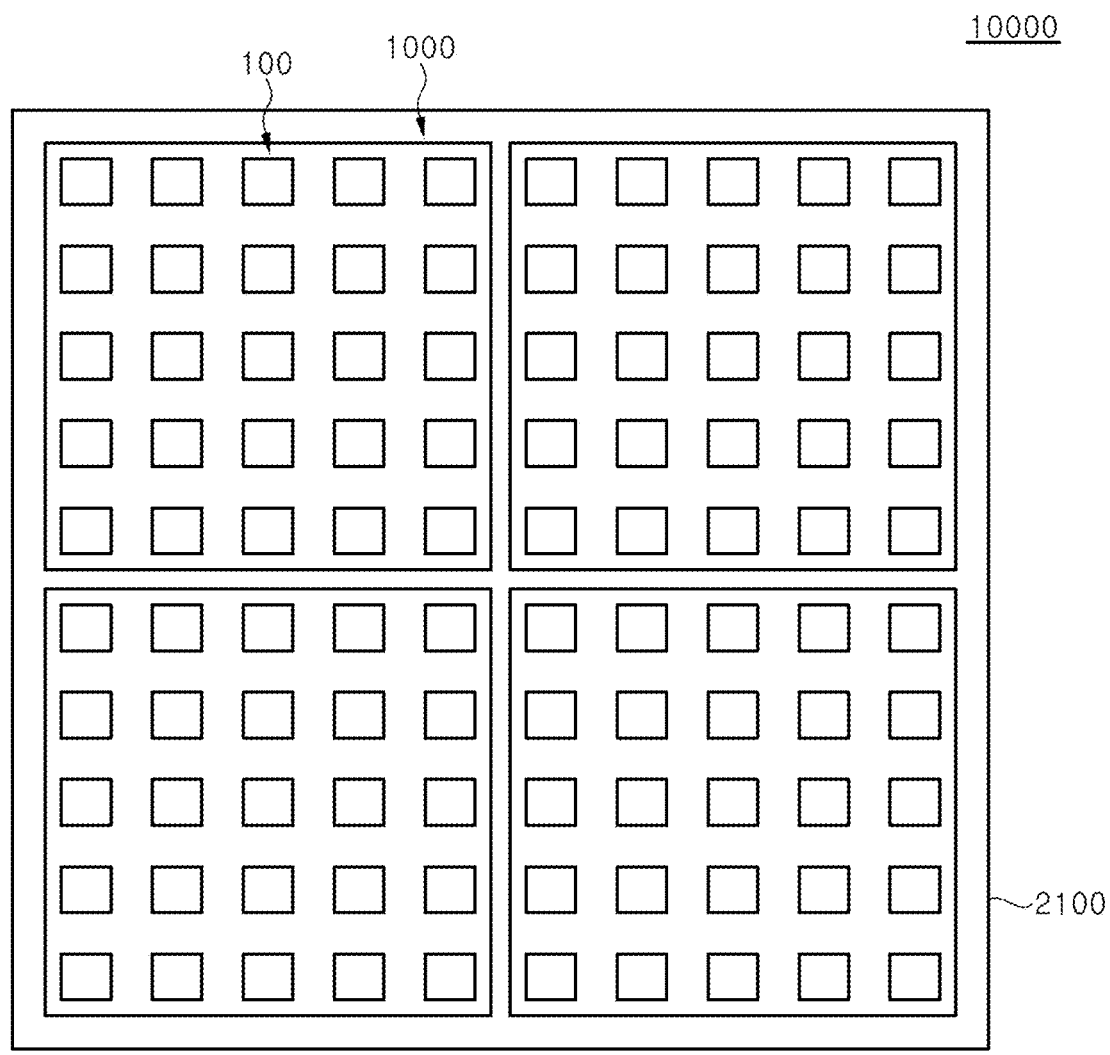
FIG. 1 is a schematic plan view illustrating a displaying apparatus according to an exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A circuit board according to one or more exemplary embodiments of the present disclosure includes a base having a plurality of interconnections on an upper surface thereof, a first photosensitive solder resist (PSR) covering the interconnections and defining a pad open region exposing portions of the interconnections, and a second PSR covering the first PSR and having an opening exposing the pad open region, in which the opening of the second PSR is larger than the pad open region of the first PSR.

The second PSR may be thicker than the first PSR. In an exemplary embodiment, the first PSR may have a thickness of about 10 μm to about 15 μm, and the second PSR may have a thickness of about 20 μm to about 25 μm.

The pad open region may expose respective portions of four interconnections.

Each of the interconnections may include a first portion located in the pad open region, a second portion located in the opening of the second PSR and covered with the first PSR, and a third portion covered with the first PSR and the second PSR.

The circuit board may be a printed circuit board.

A displaying apparatus according to one or more exemplary embodiments of the present disclosure includes a circuit board, a unit pixel disposed on the circuit board, and a molding member covering the unit pixels. The circuit board includes a base having a plurality of interconnections on an upper surface thereof, a first photosensitive solder resist (PSR) covering the interconnections and defining a pad open region exposing portions of the interconnections, and a second PSR covering the first PSR and having an opening exposing the pad open region, in which the opening of the second PSR is larger than the pad open region of the first PSR, and the unit pixel is disposed in the pad open region.

The second PSR may be thicker than the first PSR. In an exemplary embodiment, the first PSR may have a thickness of about 10 μm to about 15 μm, and the second PSR may have a thickness of about 20 μm to about 25 μm.

The pad open region may expose respective portions of four interconnections.

Each of the interconnections may include a first portion located in the pad open region, a second portion located in the opening of the second PSR and covered with the first PSR, and a third portion covered with the first PSR and the second PSR.

The circuit board may be a printed circuit board.

In some exemplary embodiments, the unit pixel may include at least three light emitting devices disposed adjacent to one another.

In other exemplary embodiments, the unit pixel may include a plurality of light emitting stacks stacked one above another; and connection electrodes electrically connected to the light emitting stacks.

The unit pixel may cover the pad open region.

The molding member may include a light absorbing material.

The displaying apparatus may further include a display panel and a pixel module disposed on the display panel, and the pixel module may include the circuit board and the unit pixel.

A pixel module according to one or more exemplary embodiments of the present disclosure includes a circuit board, a unit pixel disposed on the circuit board, and a molding member covering the unit pixels. The circuit board includes a base having a plurality of interconnections on an upper surface thereof, a first photosensitive solder resist (PSR) covering the interconnections and defining a pad open region exposing portions of the interconnections, and a second PSR covering the first PSR and having an opening exposing the pad open region, in which the opening of the second PSR is larger than the pad open region of the first PSR, and the unit pixel is disposed in the pad open region.

The unit pixel may cover the pad open region.

Each of the interconnections may include a first portion located in the pad open region, a second portion located in the opening of the second PSR and covered with the first PSR, and a third portion covered with the first PSR and the second PSR.

Hereinafter, exemplary embodiments will be described in detail with reference to the accompanying drawings.

Figure 2:
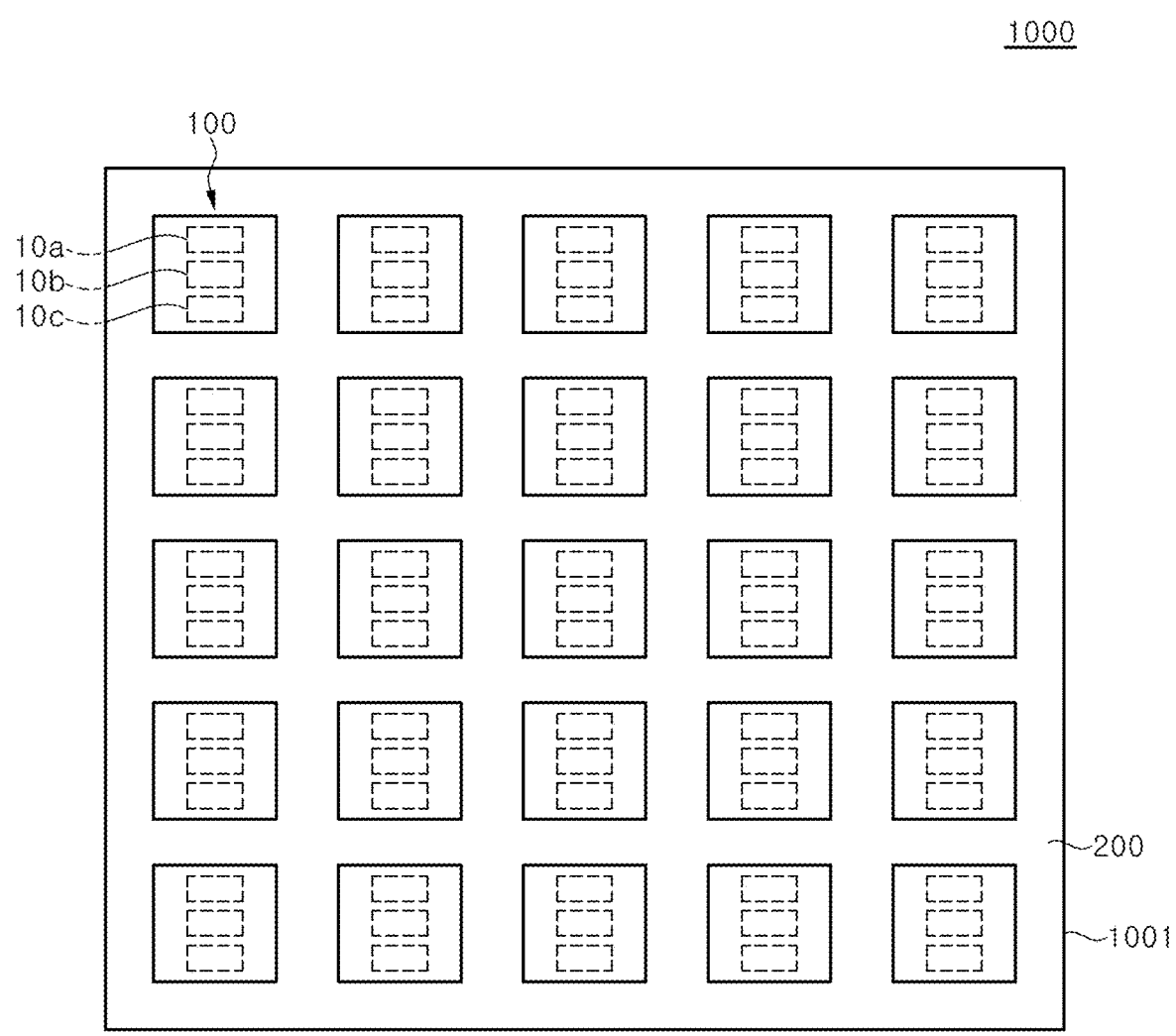
FIG. 2 is a schematic plan view illustrating a pixel module according to an exemplary embodiment.

FIG. 1 is a schematic plan view illustrating a displaying apparatus 10000 according to an exemplary embodiment, and FIG. 2 is a schematic plan view illustrating a pixel module 1000 according to an exemplary embodiment.

Referring to FIGS. 1 and 2, the displaying apparatus 10000 may include a panel substrate 2100 and a plurality of pixel modules 1000.

The displaying apparatus 10000 is not particularly limited, but it may include a virtual reality (VR) displaying apparatus such as a micro LED TV, a smart watch, a VR headset, or an augment reality (AR) displaying apparatus such as augmented reality glasses.

The panel substrate 2100 may include a circuit for a passive matrix driving or active matrix driving manner. In an exemplary embodiment, the panel substrate 2100 may include interconnections and resistors therein, and, in another exemplary embodiment, the panel substrate 2100 may include interconnections, transistors, and capacitors. The panel substrate 2100 may also have pads that are capable of being electrically connected to the disposed circuit on an upper surface thereof.

In an exemplary embodiment, the plurality of pixel modules 1000 is arranged on the panel substrate 2100. Each of the pixel modules 1000 may include a circuit board 1001, a plurality of unit pixels 100 disposed on the circuit board 1001, and a molding member 200 covering the unit pixels 100. In another exemplary embodiment, the plurality of unit pixels 100 may be arranged directly on the panel substrate 2100, and the molding member 200 may cover the unit pixels 100.

Each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line, as illustrated in FIG. 2. In an exemplary embodiment, the light emitting devices 10a, 10b, and 10c may be arranged in a vertical direction with respect to a display screen on which an image is implemented. The inventive concepts are not limited thereto, and for instance, the light emitting devices 10a, 10b, and 10c may be arranged in a lateral direction or diagonally with respect to the display screen on which the image is implemented.

While the light emitting devices 10a, 10b, and 10c are mounting directly on the panel substrate 2100, a mounting failure of a few light mounting devices may occur. All of the light emitting devices and the panel substrate 2100 may be affected by the mounting failure, leading to increased cost. Alternatively, it is possible to select desirable unit pixels 100, after manufacturing unit pixels 100 on which the light emitting devices 10a, 10b, and 10c are mounted, and mount selected unit pixels 100 on the panel substrate 2100. Cost loss may be reduced or avoided.

Hereinafter, each element of the displaying apparatus 10000 will be described in detail in an order of the light emitting devices 10a, 10b, and 10c, the unit pixel 100, and the pixel module 1000 disposed in the displaying apparatus 10000.

Figure 3A:
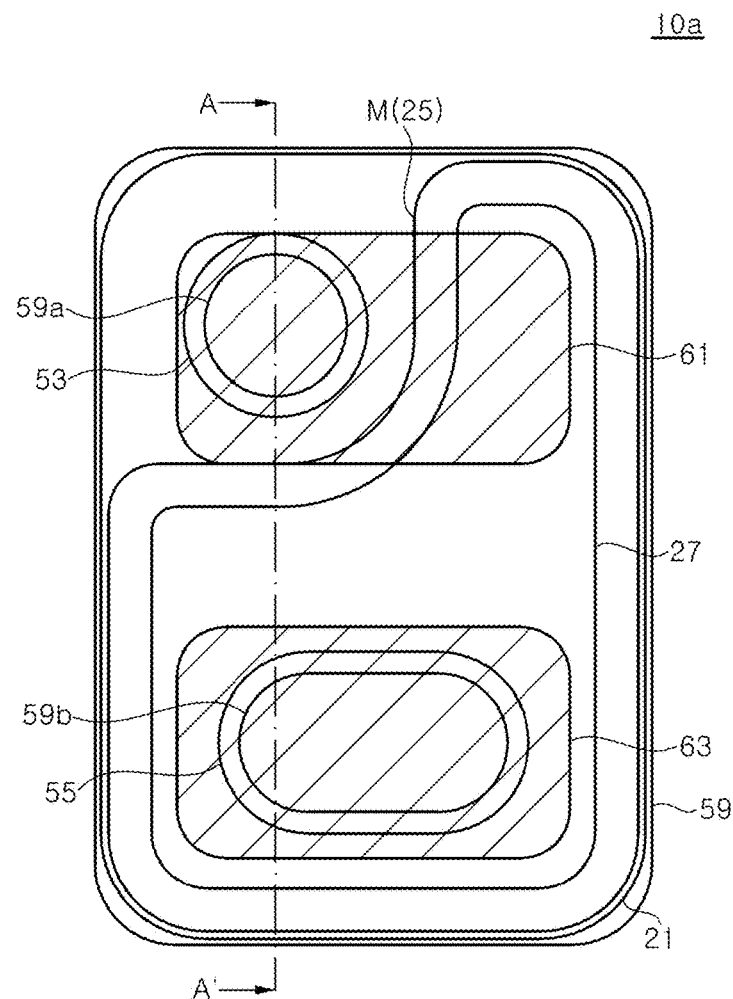
FIG. 3A is a schematic plan view illustrating a light emitting device according to an exemplary embodiment.
Figure 3B:
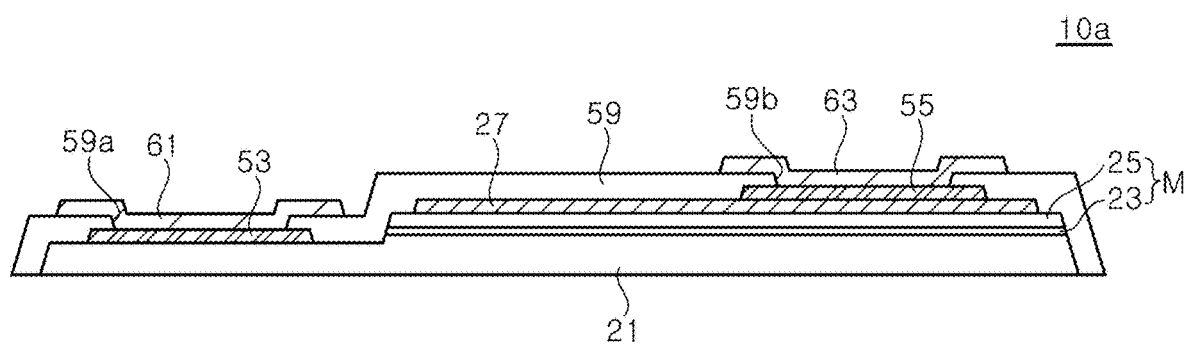
FIG. 3B is a schematic cross-sectional view taken along line A-A' of FIG. 3A.

First, FIG. 3A is a schematic plan view illustrating the light emitting device 10a according to an exemplary embodiment, and FIG. 3B is a schematic cross-sectional view taken along line A-A' of FIG. 3A. Herein, the light emitting device 10a is exemplarily described, but as the light emitting devices 10b and 10c have a substantially similar structure to that of the light emitting device 10a, repeated descriptions thereof will be omitted.

Referring to FIGS. 3A and 3B, the light emitting device 10a may include a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting device 10a may have a rectangular shape having a major axis and a minor axis in plan view. For example, a length of the major axis may have a size of about 100 μm or less, and a length of the minor axis may have a size of about 70 μm or less. In some forms, the light emitting devices 10a, 10b, and 10c may have substantially similar shapes and sizes, but the present disclosure is not limited thereto.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to form at least a portion of the first conductivity type semiconductor layer 21.

In an exemplary embodiment, in a case of the light emitting device 10a emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of the light emitting device 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in a case of the light emitting device 10c emitting blue light, the semiconductor layers may include gallium nitride (GaN), indium gallium nitride (InGaN), or zinc selenide (ZnSe).

The first conductivity type and the second conductivity type have opposite polarities, such as when the first conductivity type is an n-type, the second conductivity type becomes a p-type, or when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In a case of the light emitting device 10b or 10c emitting green light or blue light, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 3A-3B, these layers may be multiple layers, and may also include a superlattice layer. The active layer 23 may include a single quantum well structure or a multiple quantum well structure, and a composition ratio of a compound semiconductor may be adjusted to emit light with a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 3B. The mesa M is located on a partial region of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21 around the mesa M. In another exemplary embodiment, a through hole may be formed through the mesa M to expose the first conductivity type semiconductor layer 21.

In an exemplary embodiment, the first conductivity type semiconductor layer 21 may have a flat light exiting surface. In another exemplary embodiment, the first conductivity type semiconductor layer 21 may have a concave-convex pattern formed by surface texturing on a side of the light exiting surface. Surface texturing may be carried out by patterning, for example, using a dry or wet etching process. For example, cone-shaped protrusions (not shown) may be formed on the light exiting surface of the first conductivity type semiconductor layer 21, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

In another exemplary embodiment, the concave-convex pattern may include a first concave-convex pattern and a second concave-convex pattern additionally formed on the first concave-convex pattern.

By forming the concave-convex pattern on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10a, 10b, and 10c, and viewing angles of light emitted from the first, second, and third light emitting devices 10a, 10b, and 10c may become uniform. However, the inventive concepts are not limited thereto, and at least one of the light emitting devices 10a, 10b, and 10c may have a flat surface without a concave-convex pattern.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer (not shown) in ohmic contact with the first conductivity type semiconductor layer 21. The ohmic metal layer of the first contact pad 53 may be appropriately selected depending on a semiconductor material of the first conductivity type semiconductor layer 21. The first contact pad 53 may be omitted.

The second contact pad 55 may be disposed on the ohmic contact layer 27. The second contact pad 55 is electrically connected to the ohmic contact layer 27. The second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed as a single layer or multiple layers. Further, the insulation layer 59 may include a distributed Bragg reflector in which insulation layers having different refractive indices from one another are stacked. For example, the distributed Bragg reflector may include at least two insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than that for light incident at the incident angle of 0 degrees.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10b. For example, the distributed Bragg reflector formed in the blue light emitting device 10c may have a reflectance of 95% or less at the incident angle of 0 degrees for blue light generated in the active layer 23, and further 90% or less, the distributed Bragg reflector formed in the green light emitting device 10b may have a reflectance of about 95% or more and 99% or less at the incident angle of 0 degrees for green light, and the distributed Bragg reflector formed in the red light emitting device 10a may have a reflectance of 99% or more at the incident angle of 0 degrees for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, the unit pixel manufacturing process can be simplified. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like and alloys thereof may be used. For example, the first and second electrode pads 61 and 63 may include a Ti layer or a Cr layer as an upper most layer, and an Au layer thereunder.

Although the light emitting device 10*a* according to the exemplary embodiment has been briefly described with reference to FIGS. 3A-3B, the light emitting device 10*a* may further include a layer having additional functions in addition to the above-described layers. For example, various layers such as a reflection layer for reflecting light, an additional insulation layer for insulating a specific element, and a solder preventing layer for preventing diffusion of solder may be further included.

In addition, when a flip chip type light emitting device is formed, the mesa may be formed to have various shapes, and locations and shapes of the first and second electrode pads 61 and 63 may also be variously modified. Further, the ohmic contact layer 27 may be omitted, and the second contact pad 55 or the second electrode pad 63 may directly contact the second conductivity type semiconductor layer 25.

Figure 4A:
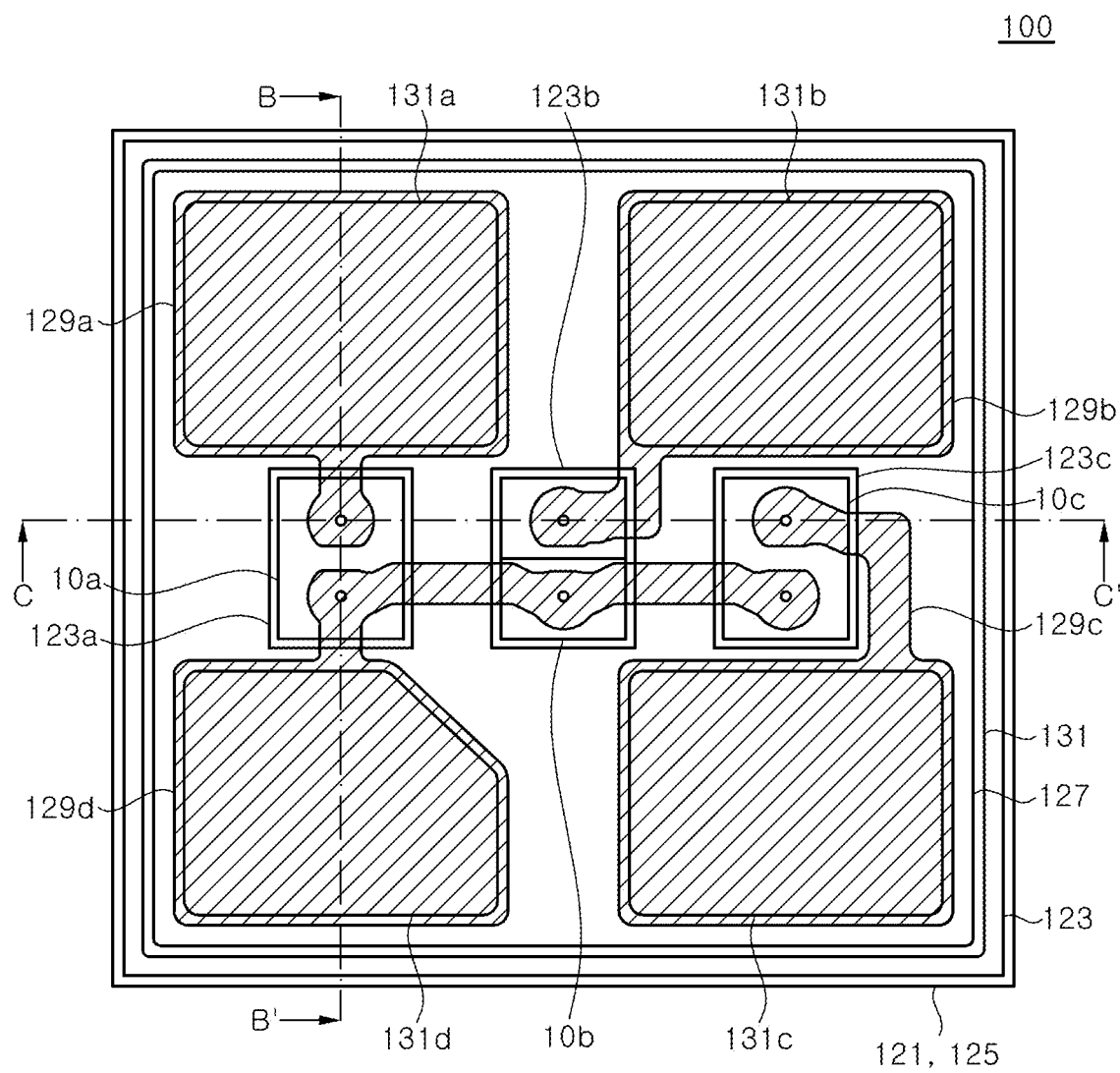
FIG. 4A is a schematic plan view illustrating a unit pixel according to an exemplary embodiment.
Figure 4B:
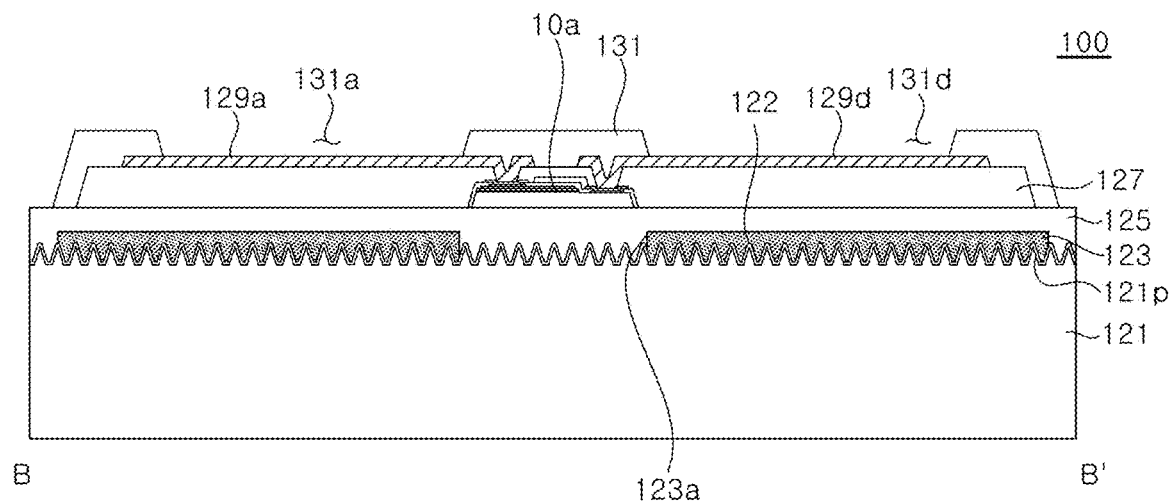
FIG. 4B is a schematic cross-sectional view taken along line B-B' of FIG. 4A.
Figure 4C:
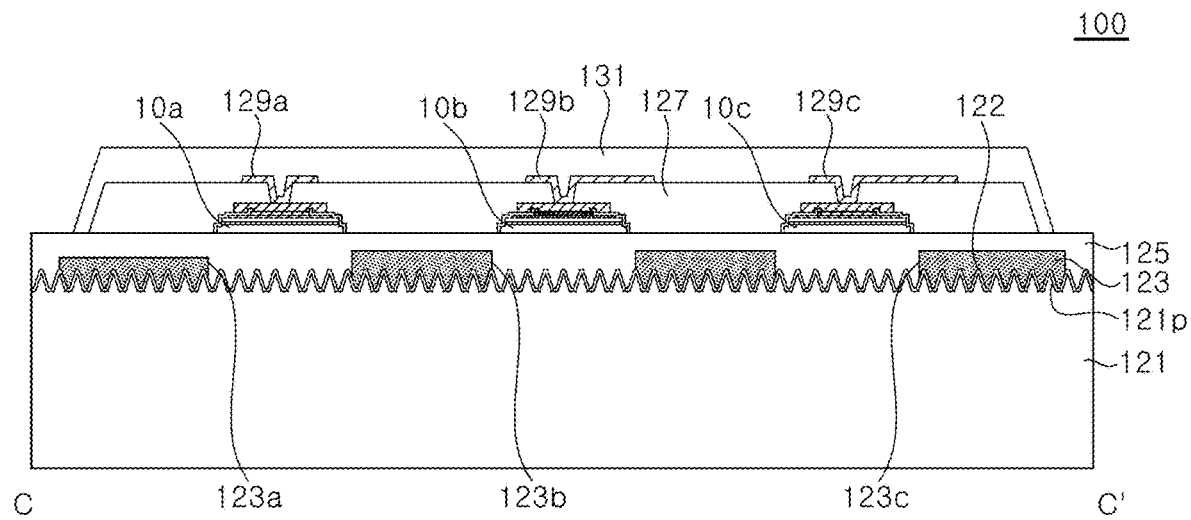
FIG. 4C is a schematic cross-sectional view taken along line C-C' of FIG. 4A.

FIG. 4A is a schematic plan view illustrating a unit pixel 100 according to an exemplary embodiment, FIG. 4B is a schematic cross-sectional view taken along line B-B' of FIG. 4A, and FIG. 4C is a schematic cross-sectional view taken along line C-C' of FIG. 4A.

Referring to FIGS. 4A, 4B, and 4C, the unit pixel 100 may include a transparent substrate 121, first, second, and third light emitting devices 10*a*, 10*b*, and 10*c*, a surface layer 122, a light blocking layer 123, an adhesive layer 125, a step adjustment layer 127, connection layers 129*a*, 129*b*, 129*c*, and 129*d*, and an insulation material layer 131.

The unit pixel 100 provides a single pixel including the first, second, and third light emitting devices 10*a*, 10*b*, and 10*c*. The first, second, and third light emitting devices 10*a*, 10*b*, and 10*c* emit light of different colors, and the first, second, and third light emitting devices 10*a*, 10*b*, and 10*c* correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus (10000 in FIG. 1), and light emitted from the light emitting devices 10*a*, 10*b*, and 10*c* is emitted to the outside through the transparent substrate 121. The transparent substrate 121 may have an upper surface and a lower surface. The transparent substrate 121 may include a concave-convex pattern 121*p* on a surface facing the light emitting devices 10*a*, 10*b*, and 10*c*, that is, the upper surface. The concave-convex pattern 121*p* scatters light emitted from the light emitting devices 10*a*, 10*b*, and 10*c* to increase a viewing angle. In addition, light emitted from the light emitting devices 10*a*, 10*b*, and 10*c* having different viewing angle characteristics from one another may be emitted at a uniform viewing angle by the concave-convex pattern 121*p*. As such, it is possible to prevent an occurrence of color difference depending on the viewing angle.

The concavo-convex pattern 121*p* may be regular or irregular. The concavo-convex pattern 121*p* may have a pitch of about 3 μm, a diameter of about 2.8 μm, and a height of about 1.8 μm, for example. The concavo-convex pattern 121*p* may be a pattern generally applied to a patterned sapphire substrate, but the inventive concepts are not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

The transparent substrate 121 is disposed on the light exiting surface and does not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 100 may be formed on the single transparent substrate 121.

The surface layer 122 covers the concave-convex pattern 121*p* of the transparent substrate 121. The surface layer 122 may be formed along a shape of the concave-convex pattern 121*p*. The surface layer 122 may improve adhesion of the light blocking layer 123 formed thereon. For example, the surface layer 122 may be formed of a silicon oxide layer. The surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10*a*, 10*b*, and 10*c* from leaking from a region between the transparent substrate 121 and the light emitting devices 10*a*, 10*b*, and 10*c* toward a side surface thereof, and may improve contrast of the displaying apparatus.

The light blocking layer 123 may have windows 123*a*, 123*b*, and 123*c* for a light path, so that light generated in the light emitting devices 10*a*, 10*b*, and 10*c* is incident on the transparent substrate 121, and for this purpose, the light blocking layer 123 on the transparent substrate 121 may be patterned so as to expose the transparent substrate 121. Widths of the windows 123*a*, 123*b*, and 123*c* may be narrower than those of the light emitting devices, but the inventive concepts are not limited thereto. For example, the widths of the windows 123*a*, 123*b*, and 123*c* may be greater than those of the light emitting devices 10*a*, 10*b*, and 10*c*, and thus, a gap may be formed between the light emitting device 10*a* and the light blocking layer 123.

The adhesive layer 125 is attached onto the transparent substrate 121. The adhesive layer 125 may cover the light blocking layer 123, as shown in FIGS. 4B-4C. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 so as to expose a region near an edge of the transparent substrate 121. The adhesive layer 125 is used to attach the light emitting devices 10*a*, 10*b*, and 10*c* to the transparent substrate 121. The adhesive layer 125 may fill the window 123*a*, 123*b*, and 123*c* formed in the light blocking layer 123.

The adhesive layer 125 may be formed as a light transmissive layer, and transmits light emitted from the light emitting devices 10*a*, 10*b*, and 10*c*. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. A light diffuser prevents the light emitting devices 10*a*, 10*b* and 10*c* from being observed from the light exiting surface.

Meanwhile, the first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed corresponding to the windows 123a, 123b, and 123c of the light blocking layer 123.

The first, second, and third light emitting devices 10a, 10b, and 10c may be disposed on a flat surface of the adhesive layer 125 as shown in FIGS. 4B and 4C. The adhesive layer 125 may be disposed under lower surfaces of the light emitting devices 10a, 10b, and 10c, as shown in FIGS. 4B-4C. In another exemplary embodiment, the adhesive layer 125 may partially cover side surfaces of the first, second, and third light emitting devices 10a, 10b, and 10c.

The first, second, and third light emitting devices 10a, 10b, and 10c may be, for example, a red light emitting device, a green light emitting device, and a blue light emitting device. The detailed configuration of each of the first, second, and third light emitting devices 10a, 10b, and 10c is described above with reference to FIGS. 3A and 3B, and a detailed description thereof will be omitted.

The first, second, and third light emitting devices 10a, 10b, and 10c may be arranged in a line, as illustrated in FIG. 4A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10a, 10b, and 10c. For example, in FIG. 4A, the clean-cut surfaces (e.g., m-plane) may be disposed up and down, and the two remaining cut surfaces (e.g., a-plane) may be disposed left and right.

In addition, each of the first, second, and third light emitting devices 10a, 10b, and 10c may be arranged in parallel to one another in a major axis direction. Minor axis directions of the first, second, and third light emitting devices 10a, 10b, and 10c may coincide with an arrangement direction of the light emitting devices.

The first, second, and third light emitting devices 10a, 10b, and 10c may have been those described above with reference to FIGS. 3A and 3B, but the inventive concepts are not limited thereto, and various light emitting devices of a lateral type or a flip-chip structure may be used.

As shown in FIGS. 4B-4C, the step adjustment layer 127 covers the first, second, and third light emitting devices 10a, 10b, and 10c and the adhesive layer 125. The step adjustment layer 127 has openings 127a exposing the first and second electrode pads 61 and 63 of the light emitting devices 10a, 10b, and 10c. The step adjustment layer 127 assists to securely form the connection layers by uniformly adjusting elevations of surfaces on which the connection layers 129a, 129b, 129c, and 129d are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

A side surface of the step adjustment layer 127 may be inclined at an angle less than 90 degrees with respect to an upper surface of the adhesive layer 125, as shown in FIG. 4B. For example, the side surface of the step adjustment layer 127 may have an inclination angle of about 60 degrees with respect to the upper surface of the adhesive layer 125.

The first, second, third, and fourth connection layers 129a, 129b, 129c, and 129d are formed on the step adjustment layer 127, as shown in FIG. 4A-4C. The connection layers 129a, 129b, 129c, and 129d may be connected to the first and second electrode pads 61 and 63 of the first, second, and third light emitting devices 10a, 10b, and 10c through the openings 127a of the step adjustment layer 127, as shown in FIG. 4C.

In an exemplary embodiment, as illustrated in FIGS. 4A and 4B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may include, for example, Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and about 50 μm or less, but the inventive concepts are not limited thereto. Meanwhile, a side surface of the insulation material layer 131 may have an inclination angle less than 90 degrees with respect to the upper surface of the adhesive layer 125, for example, an inclination angle of about 60 degrees.

The insulation material layer 131 covers side surfaces of the step adjustment layer 127 and the connection layers 129a, 129b, 129c, and 129d. In addition, the insulation material layer 131 may cover a portion of the adhesive layer 125 as shown in FIG. 4C. The insulation material layer 131 may have openings 131a, 131b, 131c, and 131d exposing the connection layers 129a, 129b, 129c, and 129d, and thus, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129*a*, 129*b*, 129*c*, and 129*d* may be surrounded by the polyimide, except for the pad regions.

Meanwhile, the unit pixel 100 may be mounted on a circuit board using a bonding material such as solder, and the bonding material may bond the connection layers 129*a*, 129*b*, 129*c*, and 129*d* exposed to the openings 131*a*, 131*b*, 131*c*, and 131*d* of the insulation material layer 131 to pads on the circuit board.

According to the illustrated exemplary embodiment, the unit pixel 100 does not include separate bumps, and the connection layers 129*a*, 129*b*, 129*c*, and 129*d* are used as bonding pads. However, the inventive concepts are not limited thereto, and bonding pads covering the openings 131*a*, 131*b*, 131*c*, and 131*d* of the insulation material layer 131 may be formed. In an exemplary embodiment, the bonding pads may be formed to partially cover the light emitting devices 10*a*, 10*b*, and 10*c* outside of upper regions of the first, second, third, and fourth connection layers 129*a*, 129*b*, 129*c*, and 129*d*.

In the illustrated exemplary embodiment, the light emitting devices 10*a*, 10*b*, and 10*c* are described as being attached to the transparent substrate 121 by the adhesive layer 125. Alternatively, the light emitting devices 10*a*, 10*b*, and 10*c* may be coupled to the transparent substrate 121 using another coupler instead of the adhesive layer 125. For example, the light emitting devices 10*a*, 10*b*, and 10*c* may be coupled to the transparent substrate 121 using spacers, and thus, gas or liquid may be filled in a region between the light emitting devices 10*a*, 10*b*, and 10*c* and the transparent substrate 121. Additionally, an optical layer that transmits light emitted from the light emitting devices 10*a*, 10*b*, and 10*c* may be formed by the gas or liquid. The adhesive layer 125 described above is also an example of the optical layer. Herein, the optical layer is formed of a material such as gas, liquid, or solid, different from those of the light emitting devices 10*a*, 10*b*, and 10*c*, and thus, is distinguished from the materials of the semiconductor layers in the light emitting devices 10*a*, 10*b*, and 10*c*.

Figure 5A:
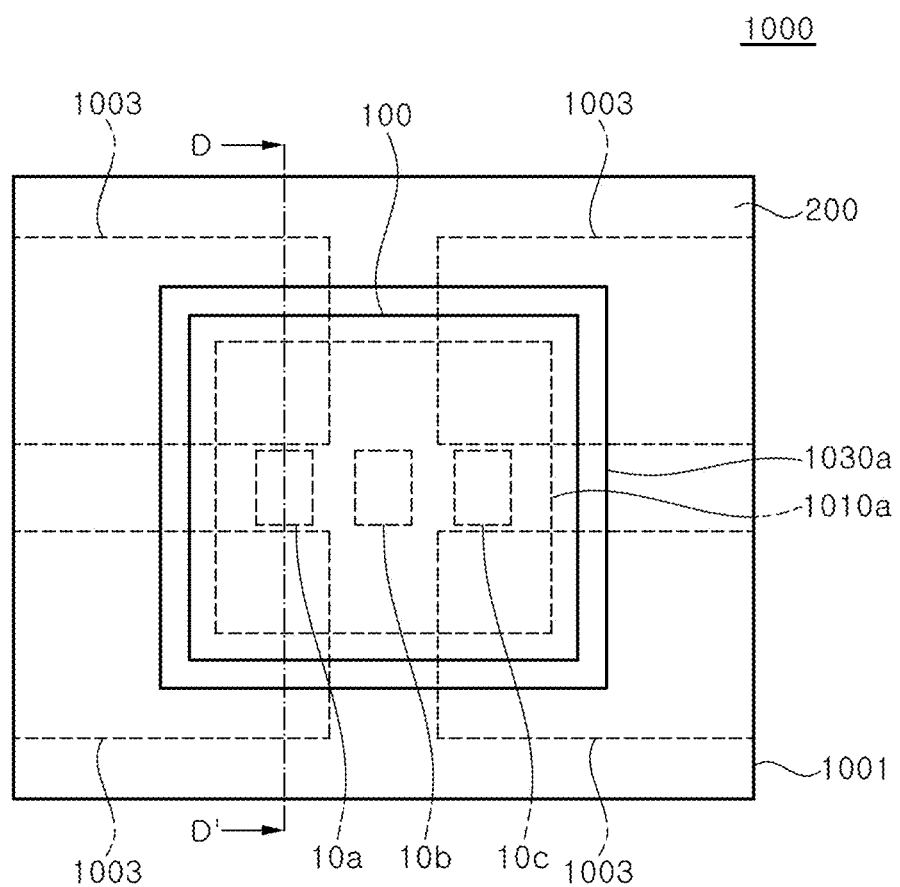
FIG. 5A is a partially enlarged plan view illustrating a portion of FIG. 2 so as to describe a pixel module according to an exemplary embodiment.
Figure 5B:
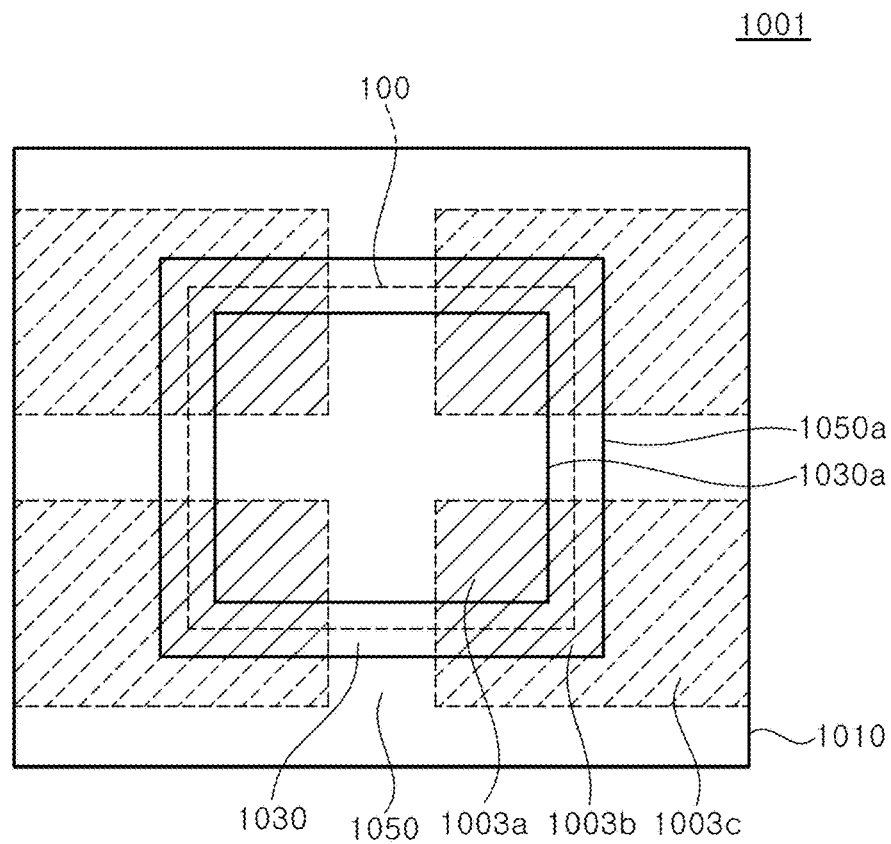
FIG. 5B is a schematic partially enlarged plan view illustrating a circuit board according to an exemplary embodiment.
Figure 5C:
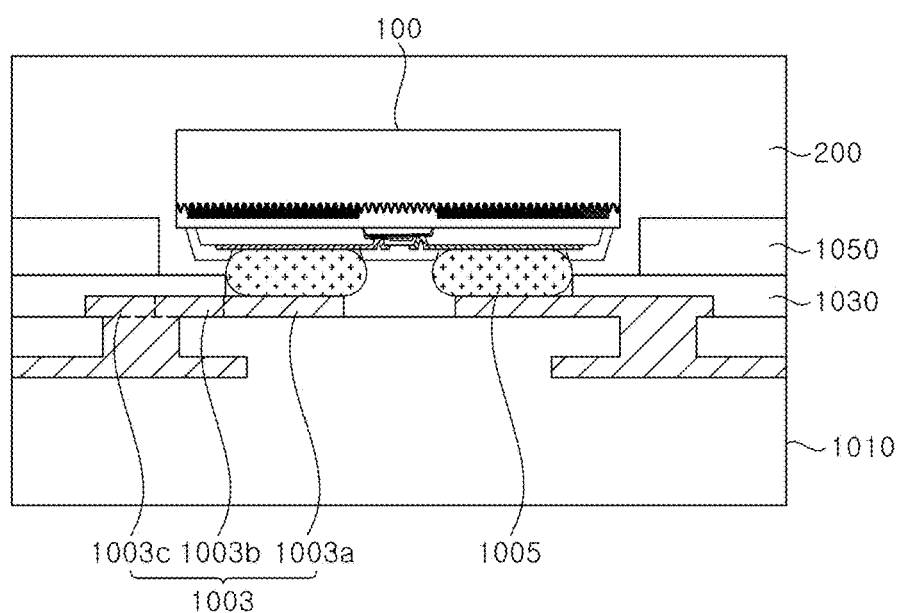
FIG. 5C is a schematic cross-sectional view taken along line D-D' of FIG. 5A.

FIG. 5A is a partially enlarged plan view illustrating a portion of FIG. 2 so as to describe the pixel module according to an exemplary embodiment, FIG. 5B is a schematic partially enlarged plan view illustrating a circuit board according to an exemplary embodiment, and FIG. 5C is a schematic cross-sectional view taken along line D-D' of FIG. 5A. Herein, FIG. 5B is a plan view illustrating the circuit board 1001 in which the molding member 200 and the unit pixel 100 are omitted from the plan view of FIG. 5A, but a location of the unit pixel 100 is indicated by a dotted line.

Referring to FIGS. 5A, 5B, and 5C, the pixel module 1000 includes the circuit board 1001 and the unit pixels 100 arranged on the circuit board 1001. Furthermore, the pixel module 1000 may further include the molding member 200 covering the unit pixels 100.

The circuit board 1001 may include a base 1010, a first photosensitive solder resist (PSR) 1030 disposed on the base 1010, and a second PSR 1050 covering the first PSR 1030. The circuit board 1001 may include a circuit for electrically connecting the panel substrate 2100 and the light emitting devices 10*a*, 10*b*, and 10*c*. The circuit board 1001 may also include a passive circuit for driving the light emitting devices 10*a*, 10*b*, and 10*c* in a passive matrix driving manner or an active circuit for driving the light emitting devices 10*a*, 10*b*, and 10*c* in an active matrix driving manner. The circuits in the circuit board 1001 may be formed in a multi-layer structure in the base 1010, and some circuits are shown in FIG. 5C. Meanwhile, interconnections 1003 are disposed on an upper surface of the base 1010.

The first PSR 1030 covers the interconnections 1003 and has a pad open region 1030*a* defining first portions 1003*a* of the interconnections. The first PSR 1030 is applied so as to cover the base 1010 and then patterned through photolithography and development processes. For example, the first PSR 1030 may be formed using an ultraviolet curable resin, a remaining region except for the pad open region 1030*a* is irradiated with ultraviolet light, and an ultraviolet curable resin of the pad open region 1030*a* may be removed through the development process. The first PSR 1030 may be formed to have a relatively thin thickness so as to clearly define the pad open region 1030*a*. The first PSR 1030 may be formed on the interconnections 1003 to have a thickness of less than 20 µm, and may be formed on the interconnections 1003 to have a thickness of, for example, about 10 µm to about 15 µm.

The first portions 1003*a* of the interconnections 1003 are exposed through the pad open region 1030*a*. Meanwhile, remaining portions 1003*b* and 1003*c* of the interconnections 1003 are covered with the first PSR 1030. Since the first PSR 1030 has a relatively thin thickness, the remaining portions 1003*b* and 1003*c* of the interconnections may be observed through the first PSR 1030.

Meanwhile, the second PSR 1050 covers the first PSR 1030. The second PSR 1050 has an opening 1050*a* exposing the pad open region 1030*a*. The opening 1050*a* is larger than the pad open region 1030*a*, and the pad open region 1030*a* is exposed through the opening 1050*a*. An area of the first PSR 1030 exposed in the opening 1050*a* of the second PSR 1050 may be 50% or less of the pad open region 1030*a*. A ratio of the exposed area of the first PSR 1030 to the pad open region 1030*a* decreases as a size of the unit pixel 100 decreases. The second PSR 1050 may be applied so as to cover the first PSR 1030 and then patterned through the photolithography and development processes. The opening 1050*a* of the second PSR 1050 does not need to be as clear as the pad open region 1030*a*, and thus, a thickness of the second PSR 1050 may be identical to or larger than that of the first PSR 1030 on the interconnections 1003. The second PSR 1050 may have a thickness of 20 µm or more, for example, about 20 µm to about 25 µm.

The first PSR 1030 and the second PSR 1050 may be formed of the same material, but the inventive concepts are not limited thereto. The first PSR 1030 and the second PSR 1050 may include an ultraviolet curable resin and a light absorbing material dispersed in the ultraviolet curable resin. The light absorbing material is a material that absorbs visible light and may be carbon black, for example. A light transmittance of the first PSR 1030 and a light transmittance of the second PSR 1050 may be adjusted using the light absorbing material. However, since excessive addition of the light absorbing material hinders resin curing by ultraviolet rays, an amount of the light absorbing material added into the ultraviolet curable resin is limited. For this reason, it is difficult to form the first PSR 1030 or the second PSR 1050 with a material having a low light transmittance.

When a single-layered PSR is used, it is difficult to lower the light transmittance of the PSR while clearly defining the pad open region. That is, if the thickness of the PSR is reduced, the pad open region is clearly defined, but as the interconnection 1003 is observed through the PSR, it is difficult to implement black color, and if the thickness of the PSR is increased, it is difficult to clearly define the pad open region. In contrast, in the present disclosure, the second PSR 1050 is additionally formed while the pad open region 1030a is clearly defined using the first PSR 1030, an observation of the interconnection 1003 may be reduced, and thus black color may be displayed better.

As it can be seen from FIG. 5B, the interconnection 1003 may include a first portion 1003a exposed to the pad open region 1030a, a second portion 1003b covered with the first PSR 1030, and a third portion 1003c covered with the first PSR 1030 and the second PSR 1050. Herein, as the unit pixel 100 is disposed in the pad open region 1030a, the first portion 1003a is covered by the unit pixel 100. In addition, as the third portion 1003c is covered with the first PSR 1030 and the second PSR 1050, light is blocked by the entire thicknesses of the first PSR 1030 and the second PSR 1050, and thus it is difficult to observe the third portion 1003c externally. Meanwhile, an area of the unit pixel 100 may be larger than that of the pad open region 1030a and smaller than that of the opening 1050a of the second PSR 1050. Accordingly, a portion of the first PSR 1030 exposed in the opening 1050a overlaps the unit pixel 100. In addition, a portion of the second portion 1003b of the interconnection 1003 overlaps the unit pixel 100. Meanwhile, at least portions of side surfaces of the unit pixels 100 may be located inside the opening 1050a of the second PSR 1050. Accordingly, when the unit pixels 100 move in a lateral direction while the unit pixels 100 are mounted, the side surface of the unit pixel 100 may contact a side wall of the opening 1050a of the second PSR 1050 and thus, it is possible to prevent the unit pixel 100 from being deviated from the opening 1050a.

Meanwhile, as a portion among the second portion 1003b of the interconnection 1003 disposed outside the unit pixel 100 is covered only by the first PSR 1030, the second portion 1003b may be observed externally. However, the second portion 1003b is located in a region between the pad open region 1030a and the opening 1050a and furthermore, a part of the second portion 1003b is covered by the unit pixel 100, and therefore, the interconnection portion that can be observed from the outside is limited to an extremely small region.

The detailed configuration of the unit pixels 100 is described above with reference to FIGS. 4A, 4B, and 4C. The unit pixels 100 may be arranged on the circuit board 1001. The unit pixels 100 may be arranged in various matrices, such as 2×2, 2×3, 3×3, 4×4, 5×5, and the like. Examples in which the unit pixels 100 are arranged in matrices of 2×2 and 3×2 will be described later with reference to FIGS. 8A through 9C.

As shown in FIG. 5C, the unit pixels 100 may be bonded to the circuit board 1001 through a bonding material 1005. For example, the bonding material 1005 bonds, to the first portions on the circuit board 1001 (i.e., pads 1003a), connection layers 229a, 229b, 229c, and 229d exposed through the openings 131a, 131b, 131c, and 131d of the insulation material layer 131 described with reference to FIGS. 4A, 4B, and 4C. For example, the bonding material 1005 may be solder, and after a solder paste is disposed on the pads 1003a on the circuit board 1001 using a technology such as screen printing, the unit pixel 100 and the circuit board 1001 may be bonded through a reflow process. The pads 1003a on the circuit board 1001 are disposed under the first and second PSRs 1030 and 1050, and an upper surface of the unit pixel 100 may protrude above an upper surface of the second PSR 1050.

According to the illustrated exemplary embodiment, the bonding material 1005 having a single structure may be disposed between the connection layers 129a, 129b, 129c, and 129d and the pads 1003a, and the bonding material 1005 may directly connect the connection layers 129a, 129b, 129c, and 129d and the pads 1003a. Alternatively, metallic bumps may be formed on the connection layers 129a, 129b, 129c and 129d, and the metallic bumps may be bonded to the pads 1003a through the bonding material 1005.

The molding member 200 covers the plurality of unit pixels 100. A total thickness of the molding member 200 may be in a range of about 150 um to 350 um. The molding member 200 may be a single layer, without being limited thereto, but it may be a multilayer. The molding member 200 may be a transparent or opaque molding member. Furthermore, the molding member 200 may further include a light diffusion layer. The light diffusion layer may include a transparent matrix such as an epoxy molding compound and light diffusion particles dispersed in the transparent matrix. The light diffusion particles may be, for example, silica or $TiO_2$, without being limited thereto.

The opaque molding member includes, for example, a transparent matrix and a material that absorbs light in the transparent matrix. The matrix may be, for example, a dry-film type solder resist (DFSR), photoimageable solder resist (PSR), an epoxy molding compound (EMC), or the like, without being limited thereto. The light absorbing material may include a light absorbing dye such as carbon black. The light absorbing dye may be directly dispersed in the matrix, or may be coated on surfaces of organic or inorganic particles to be dispersed in the matrix. Various types of organic or inorganic particles may be used so as to coat the light absorbing material. For example, particles coated with $TiO_2$ or silica particles with carbon black may be used. A light transmittance may be adjusted by adjusting a concentration of the light absorbing material contained in the molding member 200.

The molding member 200 may be formed as a single layer in which the light absorbing material is uniformly dispersed, but the inventive concepts are not limited thereto. The molding member 200 may be formed of a plurality of layers having different concentrations of the light absorbing material. For example, the molding member 200 may include two layers having different concentrations of the light absorbing material.

In an exemplary embodiment, when the molding member 200 is formed of the plurality of layers, the layers may be clearly distinguished from one another. For example, after the layers having different concentrations of the light absorbing material are individually manufactured as films, the molding member 200 may be manufactured by sandwiching the films. Alternatively, the molding member 200 may be formed by continuously printing the layers having different concentrations of the light absorbing material. In another exemplary embodiment, the molding member 200 may be formed such that the concentration of the light absorbing material gradually decreases in a thickness direction thereof.

Light incident perpendicularly from the unit pixels 100 has a short path passing through the molding member 200 and thus, easily passes through the molding member 200, but light incident with an inclination angle has a long path through the molding member 200. As such, when the molding member 200 is formed of a black molding member, light interference between the unit pixels 100 may be prevented, and a contrast of the displaying apparatus may be improved and a color deviation may be reduced.

The molding member 200 may be formed using, for example, the technique such as lamination, spin coating, slit coating, printing, or the like. As an example, the molding member 200 may be formed on the unit pixels 100 by vacuum lamination using a molding member in a form of a film or a sheet.

A displaying apparatus 10000 may be provided by mounting the plurality of pixel modules 1000 on the panel substrate 2100 of FIG. 1. The circuit board 1001 has bottom pads connected to the pads 1003a. The bottom pads may be disposed to correspond one-to-one to the pads 1003a, but the number of the bottom pads may be reduced through a common connection.

In the illustrated exemplary embodiment, the unit pixels 100 are formed into the pixel module 1000, the pixel modules 1000 are mounted on the panel substrate 2100, and the displaying apparatus 10000 may be provided, and thus, a process yield of the displaying apparatus may be improved. However, the inventive concepts are not limited thereto, and the unit pixels 100 may be directly mounted on the panel substrate 2100.

Figure 6A:
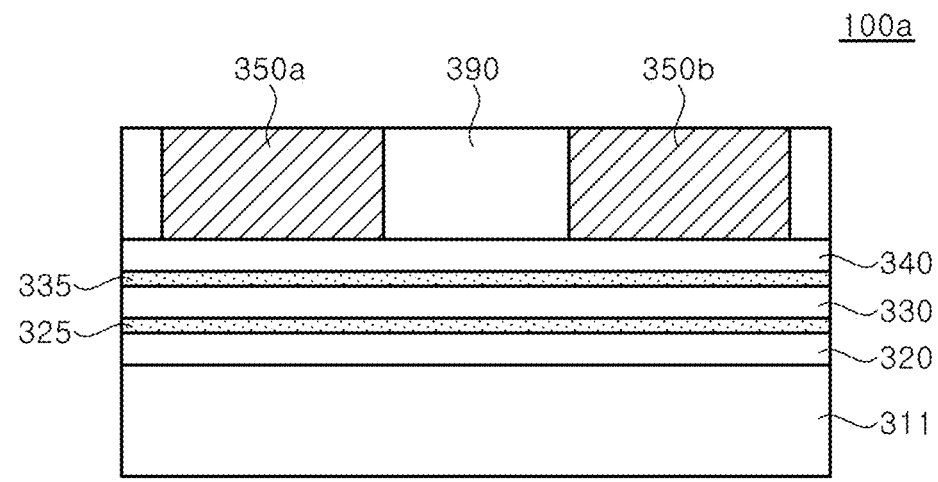
FIG. 6A is a schematic cross-sectional view illustrating a unit pixel according to another exemplary embodiment.
Figure 6B:
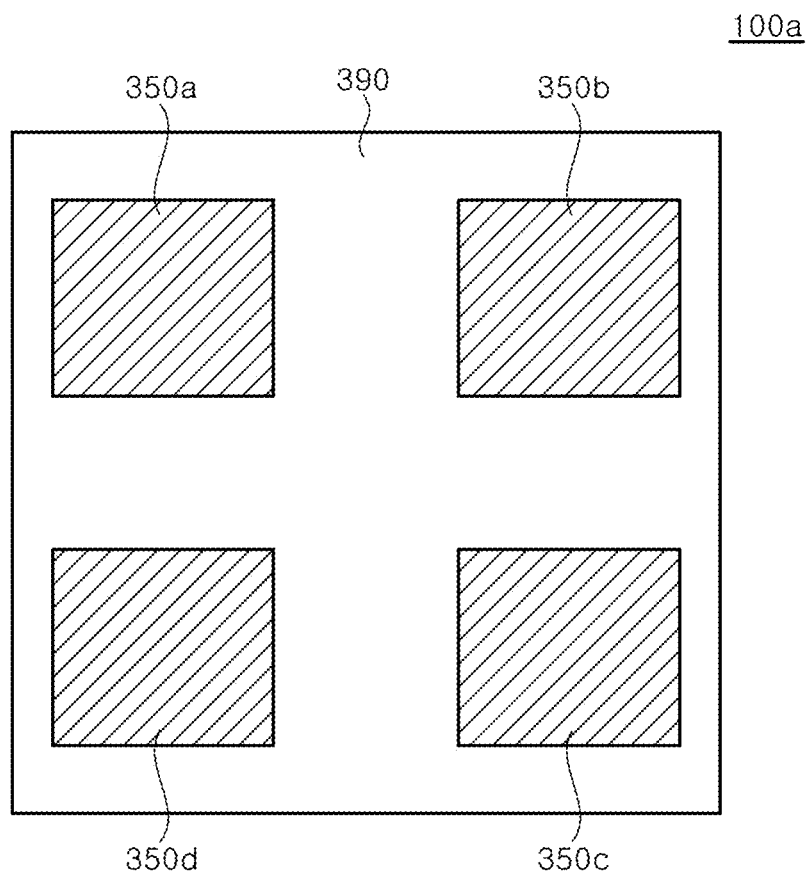
FIG. 6B is a schematic plan view illustrating a unit pixel according to another exemplary embodiment.

FIG. 6A is a schematic cross-sectional view illustrating a unit pixel 100a according to another exemplary embodiment, and FIG. 6B is a schematic plan view illustrating the unit pixel 100a according to FIG. 6A.

Referring to FIGS. 6A and 6B, the unit pixel 100a has a structure in which first, second, and third light emitting stacks 320, 330, and 340 are stacked, unlike the unit pixel 100 described with reference to FIGS. 4A, 4B, and 4C.

The unit pixel 100a includes a light emitting stacked structure, a first connection electrode 350a, a second connection electrode 350b, a third connection electrode 350c, and a fourth connection electrode 350d formed on the light emitting stacked structure, and a passivation layer 390 surrounding the connection electrodes 350a, 350b, 350c, and 350d. The unit pixel 100a may also include a substrate 311. Meanwhile, the light emitting stacked structure may include the first light emitting stack 320, the second light emitting stack 330, and the third light emitting stack 340. Although the light emitting stacked structure has been illustrated as being configured to include the three light emitting stacks 320, 330, and 340, the inventive concepts are not limited to a specific number of light emitting stacks. For example, in some exemplary embodiments, the light emitting stacked structure may include two or more light emitting stacks. Herein, it will be described that the unit pixel 100a includes the three light emitting stacks 320, 330, and 340 according to an exemplary embodiment.

The substrate 311 may be a light transmissive insulating substrate. However, in some exemplary embodiments, the substrate 311 may be formed to be translucent or partially transparent so as to transmit only light of a specific wavelength or transmit only a portion of light of a specific wavelength. The substrate 311 may be a growth substrate on which the first light emitting stack 320 may be epitaxially grown, for example, a sapphire substrate. However, the substrate 311 is not limited to the sapphire substrate, and may include various other transparent insulating materials. For example, the substrate 311 may include a glass, a quartz, a silicon, an organic polymer, or an organic-inorganic composite material, and may be, for example, such as silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 311 may include irregularities on an upper surface thereof, and may be, for example, a patterned sapphire substrate. By including the irregularities on the upper surface, extraction efficiency of light generated in the first light emitting stack 320 in contact with the substrate 311 may be increased. The irregularities of the substrate 311 may be employed so as to selectively increase a luminous intensity of the first LED stack 320 compared to the second LED stack 330 and the third LED stack 340.

The first, second, and third light emitting stacks 320, 330, and 340 are configured to emit light towards the substrate 311. Accordingly, light emitted from the third light emitting stack 340 may pass through the first and second light emitting stacks 320 and 330. According to an exemplary embodiment, the first, second, and third light emitting stacks 320, 330, and 340 may emit light of different peak wavelengths from one another. In general, the light emitting stack disposed farther from the substrate 311 emits light of a longer wavelength than that of the light emitting stack disposed near the substrate 311, thereby reducing a light loss. However, in the present disclosure, so as to adjust a color mixing ratio of the first, second, and third light emitting stacks 320, 330, and 340, the second LED stack 330 may emit light of a shorter wavelength than that of the first LED stack 320. Accordingly, it is possible to reduce the luminous intensity of the second LED stack 330 and increase the luminous intensity of the first LED stack 320, and thus, it is possible to dramatically change a luminous intensity ratio of light emitted from the first, second, and third light emitting stacks. For example, the first light emitting stack 320 may be configured to emit green light, the second light emitting stack 330 to emit blue light, and the third light emitting stack 340 to emit red light. Accordingly, it is possible to relatively decrease the luminous intensity of blue light and relatively increase the luminous intensity of green light. As a result, the luminous intensity ratio of red, green, and blue may be adjusted to be close to 3:6:1. Furthermore, an emission area of the first, second, and third LED stacks 320, 330, and 340 may be less than or equal to about 10000 $\mu m^2$, specifically, may be less than or equal to 4000 $\mu m^2$. Additionally, or alternatively, an emission area of the first, second, and third LED stacks 320, 330, and 340 may be less than or equal to 2500 $\mu m^2$. In addition, the emission area may be increased with a decreasing distance to the substrate 311, and the luminous intensity of green light may be further increased by disposing the first LED stack 320 emitting green light closest to the substrate 311.

The first to the third light emitting stacks 320, 330, and 340 include, as those described with reference to FIGS. 3A and 3B, a first conductivity type semiconductor layer 21, an active layer 23, and a second conductivity type semiconductor layer 25, respectively. According to an exemplary embodiment, the first light emitting stack 320 may include a semiconductor material emitting green light, such as GaN, InGaN, GaP, AlGaInP, AlGaP, or the like. The second light emitting stack 330 may include a semiconductor material emitting blue light, such as GaN, InGaN, ZnSe, or the like, without being limited thereto. According to an exemplary embodiment, the third light emitting stack 340 may include, for example, a semiconductor material emitting red light such as AlGaAs, GaAsP, AlGaInP, GaP, or the like, without being limited thereto.

According to an exemplary embodiment, each of the first conductivity type semiconductor layers 21 and the second conductivity type semiconductor layers 25 of the first, second, and third light emitting stacks 320, 330, and 340 may have a single-layered structure or a multi-layered structure and, in some exemplary embodiments, may include a superlattice layer. Furthermore, the active layers 23 of the first, second, and third light emitting stacks 320, 330, and 340 may have a single quantum well structure or a multiple quantum well structure.

A first adhesive layer 325 is disposed between the first light emitting stack 320 and the second light emitting stack 330, and a second adhesive layer 335 is disposed between the second light emitting stack 330 and the third light emitting stack 340. The first and second adhesive layers 325 and 335 may include a non-conductive material that transmits light. For example, the first and second adhesive layers 325 and 335 may include an optically clear adhesive (OCA), which may include epoxy, polyimide, SUB, spin-on-glass (SOG), benzocyclobutene (BCB), without being limited thereto.

According to an exemplary embodiment, each of the first, second, and third light emitting stacks 320, 330, and 340 may be driven independently. More specifically, a common voltage may be applied to one of the first and second conductivity type semiconductor layers of each of the light emitting stacks, and an individual light emitting signal may be applied to another one of the first and second conductivity type semiconductor layers of each of the light emitting stacks. According to an exemplary embodiment of the present disclosure, the first conductivity type semiconductor layer 21 of each of the light emitting stacks may be n-type, and the second conductivity type semiconductor layer 25 may be p-type. In the first light emitting stack 320, the second light emitting stack 330, and the third light emitting stack 340, the n-type semiconductor layer and the p-type semiconductor layer may be arranged in the same sequence, but the inventive concepts are not limited thereto. For example, the first light emitting stack 320 may have a reversely stacked sequence compared to those of the second light emitting stack 330 and the third light emitting stack 340. The first, second, and third light emitting stacks 320, 330, and 340 may have a common p-type light emitting stacked structure in which the p-type semiconductor layers are commonly electrically connected, or may have a common n-type light emitting stacked structure in which the n-type semiconductor layers are commonly electrically connected.

According to the illustrated exemplary embodiment, each of the connection electrodes 350a, 350b, 350c, and 350d may have a substantially elongated shape protruding from the substrate 311. The connection electrodes 350a, 350b, 350c, and 350d may include a metal such as Cu, Ni, Ti, Sb, Zn, Mo, Co, Sn, Ag, or an alloy thereof, without being limited thereto. For example, each of the connection electrodes 350a, 350b, 350c, and 350d may include two or more metals or a plurality of different metallic layers so as to reduce stress from the elongated shape of the connection electrodes 350a, 350b, 350c, and 350d. In another exemplary embodiment, when the connection electrodes 350a, 350b, 350c, and 350d include Cu, an additional metal may be deposited or plated to suppress oxidation of Cu. In some exemplary embodiments, when the connection electrodes 350a, 350b, 350c, and 350d include Cu/Ni/Sn, Cu may prevent Sn from infiltrating into the light emitting stacked structure. In some exemplary embodiments, the connection electrodes 350a, 350b, 350c, and 350d may include a seed layer for forming a metallic layer during a plating process, which will be described later.

As shown in FIG. 6B, each of the connection electrodes 350a, 350b, 350c, and 350d may have a substantially flat upper surface, and thus, an electrical connection between an external line or an electrode and the light emitting stacked structure may be facilitated, which will be described later.

According to an exemplary embodiment of the present disclosure, when the unit pixel 100a is a micro-LED, which has a surface area less than about 10,000 $\mu m^2$ as known in the art, the connection electrodes 350a, 350b, 350c, and 350d may overlap a portion of at least one of the first, second, and third light emitting stacks 320, 330, and 340 as shown in FIGS. 6A-6B. The unit pixel 100a has a surface area less than about 4,000 $\mu m^2$ or 2,500 $\mu m^2$ in other exemplary embodiments. In some forms, the connection electrodes 350a, 350b, 350c, and 350d are illustrated as having a quadrangular pillar shape, but the present disclosure is not limited thereto, and other shapes such as a cylindrical shape are possible. Furthermore, areas of lower surfaces of the connection electrodes 350a, 350b, 350c, and 350d may be larger than those of the upper surfaces thereof. For example, when the first to third light emitting stacks 320, 330, and 340 are patterned so as to form electrodes, the connection electrodes 350a, 350b, 350c and 350d may cover side surfaces of the first to third light emitting stacks 320, 330, and 340.

In general, during manufacturing, an array of a plurality of unit pixels 100a is formed on the substrate 311. The substrate 311 may be cut along scribing lines to be singularized (isolated) into each unit pixel 100a, and the unit pixel 100a may be transferred to another substrate or tape using various transferring techniques. In this case, when the unit pixel 100a includes the connection electrodes 350a, 350b, 350c, and 350d such as metallic bumps or pillars protruding outward, various drawbacks may occur during subsequent processes, for example, in a transferring step, due to the structure in which the connection electrodes 350a, 350b, 350c, and 350d are exposed to the outside. Moreover, when the unit pixel 100a includes a micro-LED, which has a surface area less than about 10,000 $\mu m^2$, such as less than about 4,000 $\mu^2$, or less than about 2,500 $\mu m^2$, depending upon applications, handling of the unit pixel 100a may become more difficult due to its small form factor.

For example, when the connection electrodes 350a, 350b, 350c, and 350d have a substantially elongated shape such as a rod, transferring the unit pixel 100a using a conventional vacuum method is difficult due to a protruding structure of the connection electrode due to an insufficient suction area. In addition, the exposed connection electrode may be directly affected by various stresses during subsequent processes, such as when the connection electrode is in contact with a manufacturing device, which may damage the structure of the unit pixel 100a. As another example, by attaching an adhesive tape on an upper surface (e.g., a surface opposite to the substrate 311) of the unit pixel 100a, a contact area between the unit pixel 100a and the adhesive tape may be limited to the upper surfaces of the connection electrodes 350a, 350b, 350c, and 350d when the unit pixel 100a is transferred. In this case, unlike when the adhesive tape is attached to a lower surface of the substrate, an adhesive force of the unit pixel 100a to the adhesive tape may be weakened, and the unit pixel 100a may be undesirably separated from the adhesive tape during transferring. As yet another example, when the unit pixel 100a is transferred using a conventional pick-and-place method, an ejection pin may directly contact a portion of the unit pixel 100a and damage a top structure of the light emitting structure. In particular, the ejection pin may strike a center of the unit pixel 100a and cause physical damage to the top light emitting stack of the unit pixel 100a.

According to an exemplary embodiment of the present disclosure, the passivation layer 390 may be formed on the light emitting stacked structure. More specifically, as shown in FIG. 6A, the passivation layer 390 is formed between the connection electrodes 350a, 350b, 350c, and 350d to cover side surfaces of the connection electrodes 350a, 350b, 350c, and 350d. Furthermore, although the passivation layer 390 has described as being disposed on the light emitting stacked structure in FIGS. 6A-6B, the passivation layer 390 may at least partially cover the side surfaces of the first to third light emitting stacks 320, 330, and 340, and the side surfaces of the first to third light emitting stacks 320, 330, and 340 may not be exposed to the outside of the unit pixel 100a by being covered with the passivation layer 390 and another insulation layer.

The passivation layer 390 may be formed substantially flush with the upper surfaces of the connection electrodes 350a, 350b, 350c, and 350d. The passivation layer 390 may include an epoxy molding compound (EMC), which may be formed in various colors such as black, white, or transparent. However, the inventive concepts are not limited thereto. For example, in some exemplary embodiments, the passivation layer 390 may include polyimide (PID), and in this case, the PID may be provided as a dry film rather than a liquid type so as to increase a level of flatness when applied to the light emitting stacked structure. In some exemplary embodiments, the passivation layer 390 may include a photosensitive material. In this manner, the passivation layer 390 may protect the light emitting stacked structure from an external impact that may be applied during subsequent processes, as well as providing a sufficient contact area to the unit pixel 100a so as to facilitate its handling during subsequent transferring steps. In addition, the passivation layer 390 may prevent light leakage toward the side surface of the unit pixel 100a so as to prevent or at least suppress interference of light emitted from adjacent unit pixels 100a.

The unit pixel 100a according to the illustrated exemplary embodiment may be formed to have a size smaller than that of the unit pixel 100 including the light emitting devices 10a, 10b, and 10c arranged on the same plane as the unit pixel 100a has a structure in which the first, second, and third light emitting stacks 320, 330, and 340 are stacked. For example, the unit pixel 100 may have a size of 400 μm×400 μm, and the unit pixel 100a according to the illustrated exemplary embodiment may have a size of 225 μm×225 μm.

Figure 7A:
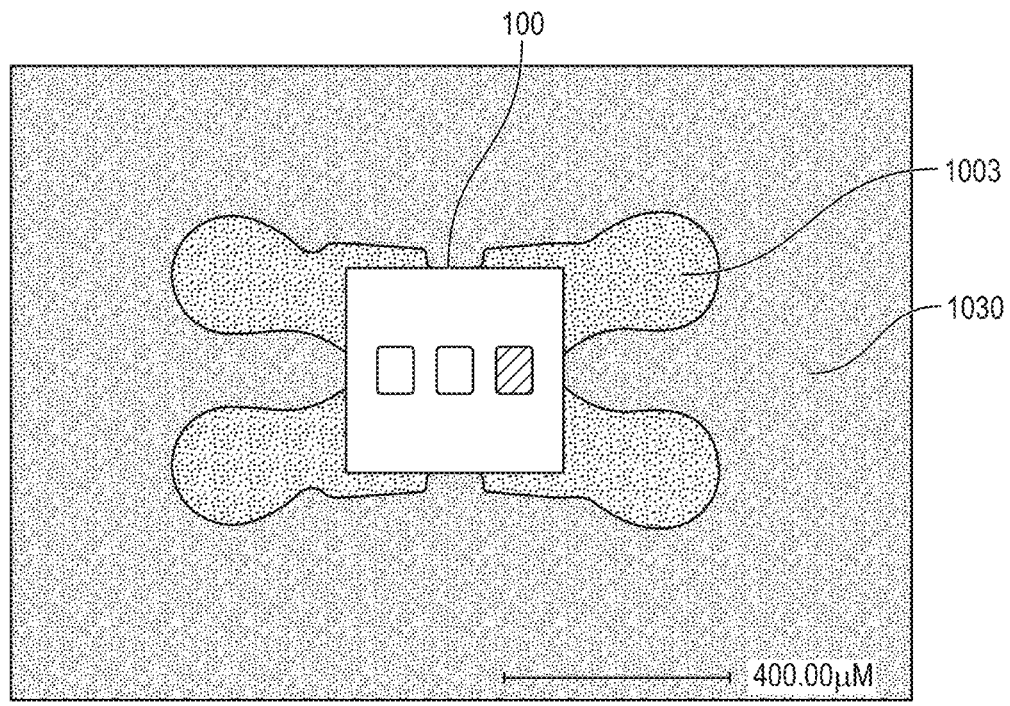
FIG. 7A is an image illustrating a pixel module according to the related art.
Figure 7B:
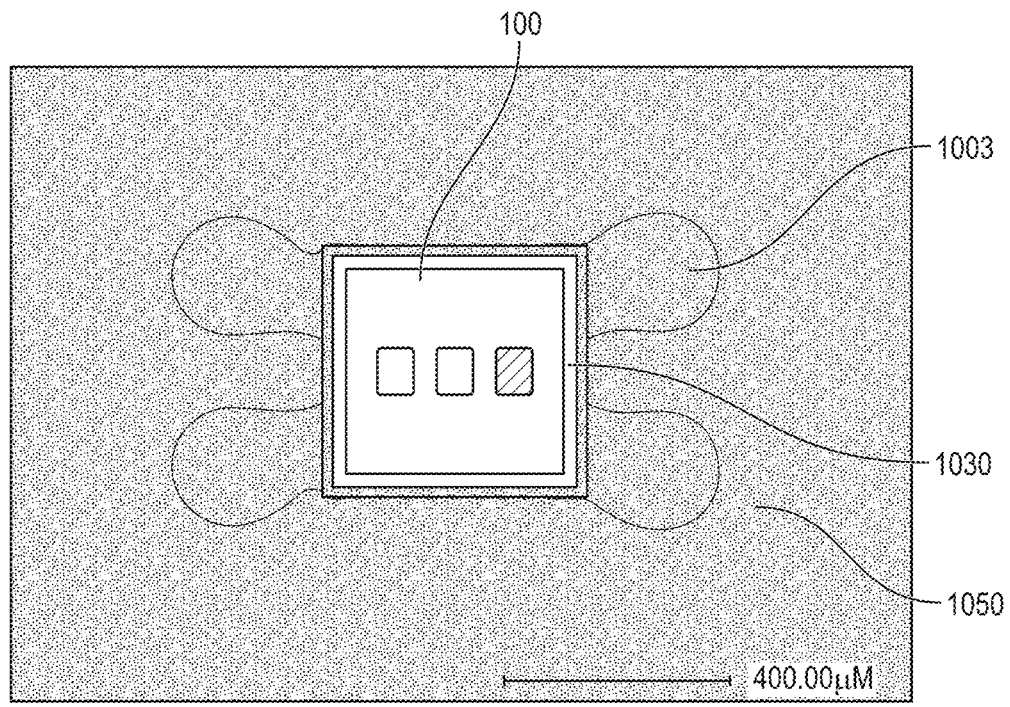
FIG. 7B is an image illustrating a pixel module according to an exemplary embodiment.

FIG. 7A is an image illustrating a pixel module according to the related art, and FIG. 7B is an image illustrating a pixel module according to an exemplary embodiment. The pixel module according to the related art uses only a first PSR 1030 to cover an interconnection 1003, and the pixel module according to the present exemplary embodiment uses a second PSR 1050 together with the first PSR 1030.

As it can be seen from FIG. 7A, when only the first PSR 1030 is used, the interconnection 1003 covered with the first PSR 1030 is clearly observed. In contrast, as it can be seen from FIG. 7B, the interconnection 1003 covered with the first PSR 1030 and the second PSR 1050 is faintly observed, and a portion of the interconnection 1003 covered only with the first PSR 1030 is relatively very small region.

In the pixel module according to an exemplary embodiment, the unit pixel 100 has an area of 400 μm×400 μm, an area of a pad open region of the first PSR 1030 is about 122,500 μm², and an area of an opening of the second PSR 1050 is about 176,400 μm². An area of the first PSR 1030 exposed through the opening of the second PSR 1050 is about 44% of the area of the pad open region of the first PSR 1030.

Meanwhile, in an example in which the pixel is manufactured using the unit pixel 100a described with reference to FIGS. 6A and 6B, the unit pixel 100a has an area of 225 μm×225 μm, an area of a pad open region of the first PSR 1030 was about 46,225 μm², and an area of the opening of the second PSR 1050 was about 60,025 μm². In this case, the area of the first PSR 1030 exposed through the opening of the second PSR 1050 is about 30% of the area of the pad open region of the first PSR 1030.

Figure 8A:
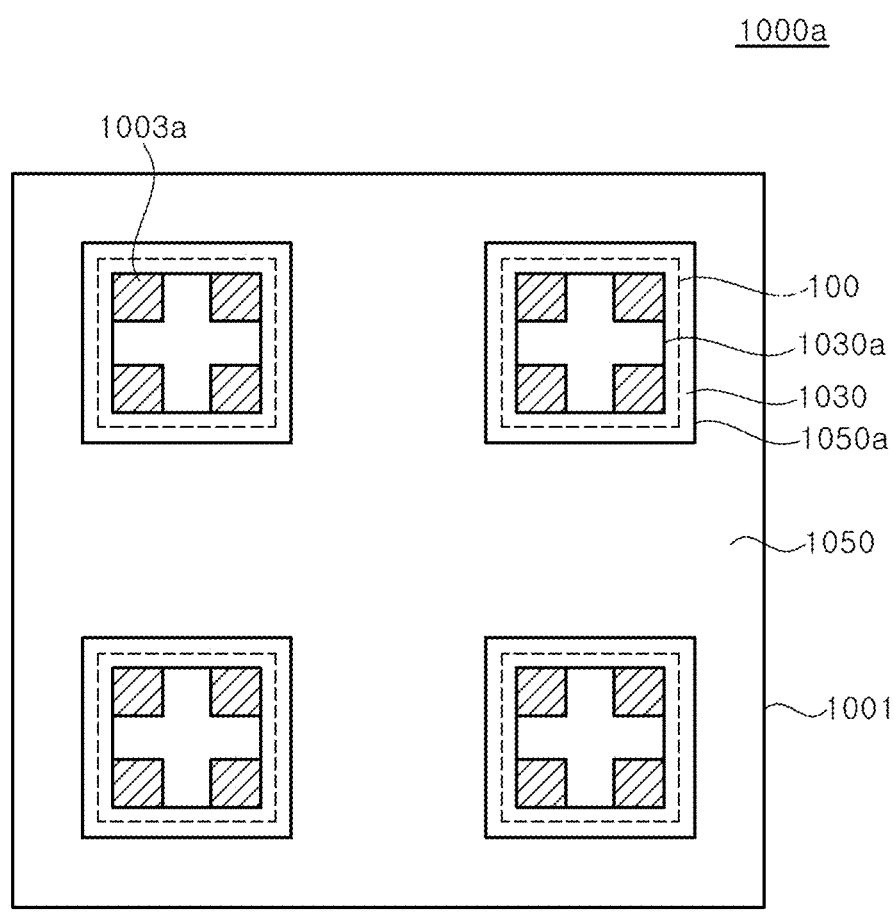
FIG. 8A is a schematic plan view illustrating a pixel module according to an exemplary embodiment.
Figure 8B:
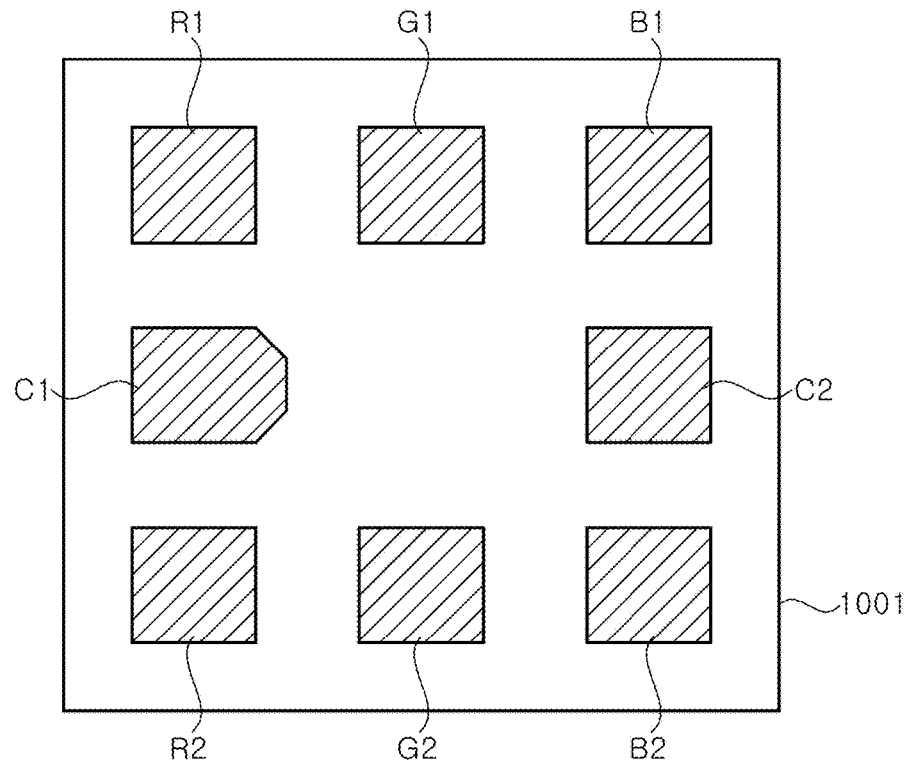
FIG. 8B is a schematic rear view illustrating the pixel module according to FIG. 8A.
Figure 8C:
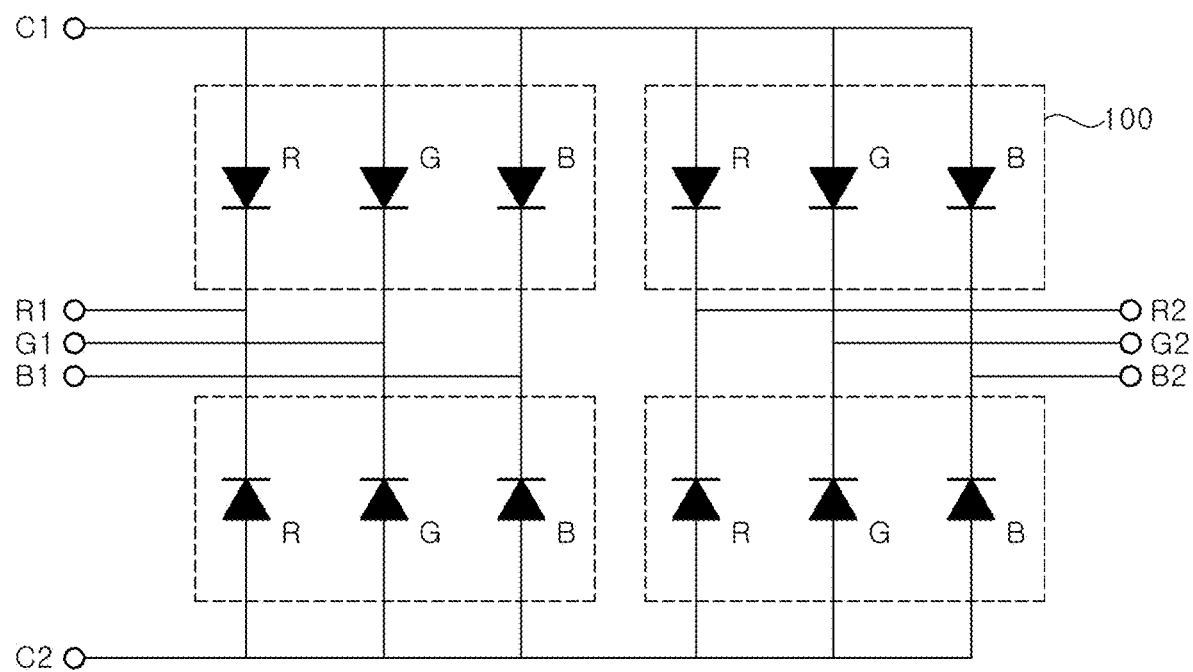
FIG. 8C is a schematic circuit diagram illustrating the pixel module according to FIG. 8A.

FIG. 8A is a schematic plan view illustrating a pixel module 1000a according to an exemplary embodiment, FIG. 8B is a schematic rear view illustrating the pixel module 1000a according to an exemplary embodiment, and FIG. 8C is a schematic circuit diagram illustrating the pixel module 1000a according to an exemplary embodiment.

Referring to FIGS. 8A, 8B, and 8C, the pixel module 1000a is substantially similar to the pixel module 1000 described above, except that the unit pixels 100 are arranged in a 2×2 matrix. That is, four unit pixels 100 are mounted on the circuit board 1001.

Four first portions 1003a corresponding to each of the unit pixels 100 are exposed by the pad open region 1030a of the first PSR 1030. Meanwhile, the opening 1050a of the second PSR 1050 has a size larger than that of the pad open region 1030a and exposes the pad open region 1030a. A portion of the first PSR 1030 around the pad open region 1030a is exposed in the opening 1050a.

The unit pixels 100 are mounted in the opening of the second PSR 1050. The unit pixel 100 has an area larger than that of the pad open region 1030a, and covers the first portions 1003a to block the first portions 1003a from being observed from the outside.

Meanwhile, terminals C1, C2, R1, R2, G1, G2, B1, and B2 for electrical connection are disposed on a rear surface of the circuit board 1001. These terminals C1, C2, R1, R2, G1, G2, B1, and B2 are electrically connected to the unit pixels 100 through the interconnections 1003 in the circuit board 1001. Multi-layered interconnections 1003 may be disposed in the circuit board 1001. The interconnections of each layer may be connected to the interconnections of other layers through vias. The terminals C1, C2, R1, R2, G1, G2, B1, and B2 disposed on the rear surface are electrically connected to the first portions 1003a disposed on an upper surface through the vias and the interconnections in the circuit board 1001.

As shown in FIG. 8C, common terminals C1 and C2 are electrically connected to the sub-pixels R, G, and B of two unit pixels 100, respectively. Meanwhile, individual terminals R1, R2, G1, G2, B1, and B2 may be electrically connected to same sub-pixels R, G, and B of two unit pixels 100, respectively. For example, the individual terminal R1 may be commonly electrically connected to the sub-pixels R of two unit pixels 100 arranged in a first column, and the individual terminal R2 may be commonly electrically connected to the sub-pixels R of two unit pixels 100 arranged in a second column. Similarly, the individual terminal G1 may be commonly electrically connected to the sub-pixels G of two unit pixels 100 arranged in the first column, and the individual terminal G2 may be commonly electrically connected to the sub-pixels G of two unit pixels 100 arranged in the second column. In addition, the individual terminal B1 may be commonly electrically connected to the sub-pixels B of two unit pixels 100 arranged in the first column, and the individual terminal B2 may be commonly electrically connected to the sub-pixels B of two unit pixels 100 arranged in the second column.

Accordingly, the sub-pixels R, G, and B in the four unit pixels 100 may be independently driven using the eight terminals. Although the number of the first portions 1003a exposed on the upper surface of the circuit board 1001 is 16, the number of the terminals may be reduced to ½ of the number of the first portions 1003a.

Figure 9A:
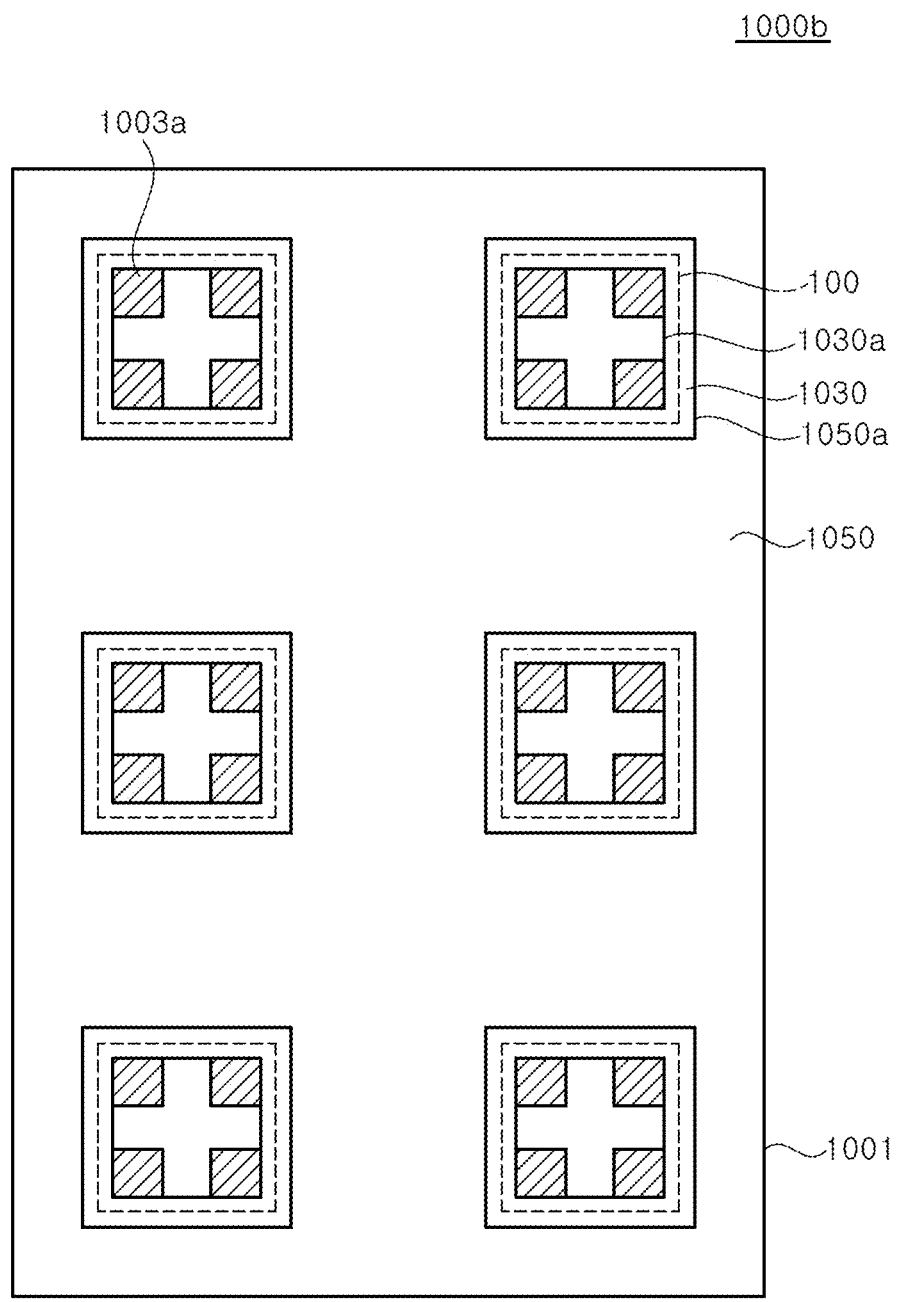
FIG. 9A is a schematic plan view illustrating a pixel module according to another exemplary embodiment.
Figure 9B:
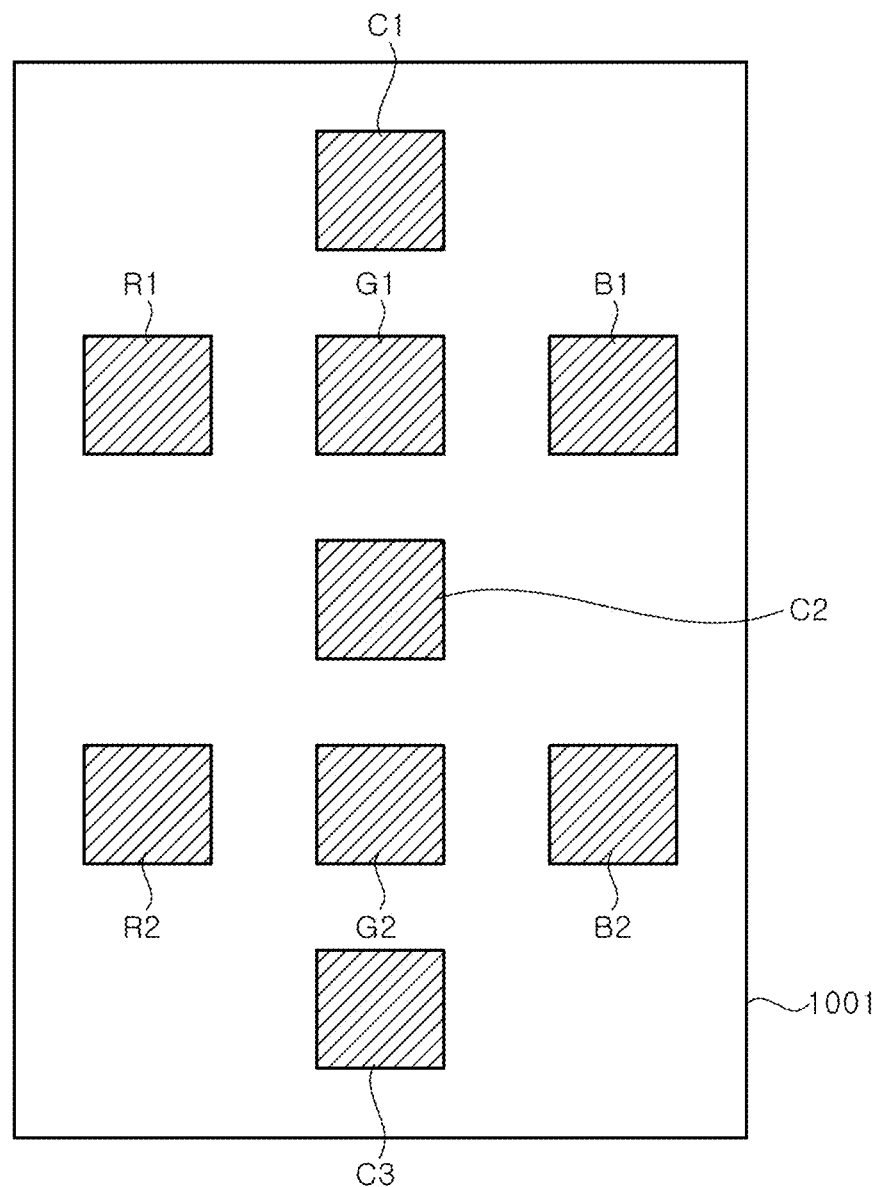
FIG. 9B is a schematic rear view illustrating the pixel module according to FIG. 9A.
Figure 9C:
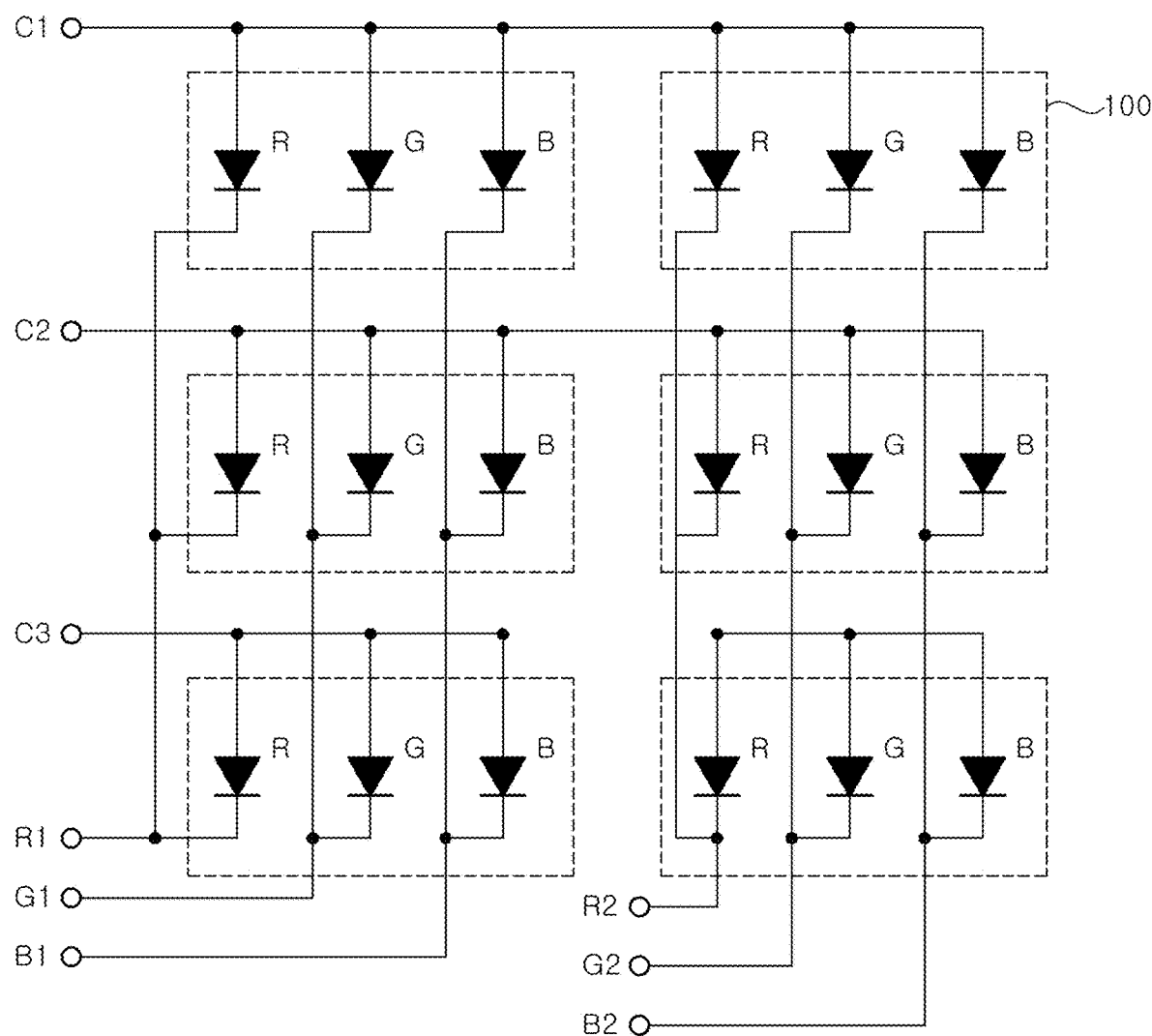
FIG. 9C is a schematic circuit diagram illustrating the pixel module according to FIG. 9A.

FIG. 9A is a schematic plan view illustrating a pixel module 1000b according to another exemplary embodiment, FIG. 9B is a schematic rear view illustrating the pixel module 1000b according to another exemplary embodiment, and FIG. 9C is a schematic circuit diagram illustrating the pixel module 1000b according to another exemplary embodiment.

Referring to FIGS. 9A, 9B, and 9C, the pixel module 1000b is substantially similar to the pixel module 1000a described above, except that the unit pixels 100 are arranged in a 3×2 matrix. Six unit pixels 100 are mounted on the circuit board 1001.

Twenty-four first portions 1003a on the upper surface of the circuit board 1001 are exposed to the pad open region 1030a of the first PSR 1030, and six unit pixels 100 are mounted in the openings 1050a of the second PSR 1050.

Meanwhile, nine terminals C1, C2, C3, R1, R2, G1, G2, B1, and B2 may be disposed on the rear surface of the circuit board 1001. Multi-layered interconnections 1003 may be disposed in the circuit board 1001, and the interconnections of each layer may be connected to the interconnections of other layers through vias. The nine terminals C1, C2, C3, R1, R2, G1, G2, B1, and B2 disposed on the rear surface are electrically connected to the first portions 1003a disposed on the upper surface through the vias and the interconnections in the circuit board 1001.

Referring to FIG. 9C, common terminals C1, C2, and C3 are commonly electrically connected to the sub-pixels R, G, and B of two unit pixels 100, respectively. Meanwhile, individual terminals R1, R2, G1, G2, B1, and B2 may be commonly electrically connected to same sub-pixels R, G, and B of three unit pixels 100, respectively. For example, the individual terminal R1 may be commonly electrically connected to the sub-pixels R of three unit pixels 100 arranged in the first column, and the individual terminal R2 may be commonly electrically connected to the sub-pixels R of three unit pixels 100 arranged in the second column. Similarly, the individual terminal G1 may be commonly electrically connected to the sub-pixels G of three unit pixels 100 arranged in the first column, and the individual terminal G2 may be commonly electrically connected to the sub-pixels G of three unit pixels 100 arranged in the second column. In addition, the individual terminal B1 may be commonly electrically connected to the sub-pixels B of three unit pixels 100 arranged in the first column, and the individual terminal B2 may be commonly electrically connected to the sub-pixels B of three unit pixels 100 arranged in the second column.

Accordingly, the sub-pixels R, G, and B in the six unit pixels 100 may be independently driven using the nine terminals. Although the number of the first portions 1003a exposed on the upper surface of the circuit board 1001 is 24, the number of the terminals may be reduced to less than ½ of the number of the first portions 1003a.

In the illustrated exemplary embodiment, although the unit pixels 100 arranged in the 3×2 matrix have been exemplarily described, it will be easy to understand even when they are arranged in a 2×3 matrix, six unit pixels 100 may be independently driven using the same number of terminals.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A circuit board, comprising:
   a base;
   a plurality of interconnections disposed on an upper surface of the base, each interconnection comprising a plurality of portions;
   a first photosensitive solder resist (PSR) covering a portion of each of the plurality of interconnections, the first PSR arranged to define a pad open region configured to expose a remainder portion of each of the plurality of interconnection; and
   a second PSR covering the first PSR and having an opening configured to expose the pad open region,
   wherein the opening of the second PSR is larger than the pad open region of the first PSR.

2. The circuit board of claim 1,
   wherein the second PSR is thicker than the first PSR.

3. The circuit board of claim 2, wherein:
   the first PSR has a thickness of about 10 μm to about 15 μm, and
   the second PSR has a thickness of about 20 μm to about 25 μm.

4. The circuit board of claim 1,
   wherein the plurality of interconnections includes four interconnections disposed on the upper surface of the base and the first PSR covers the portion of each of the four interconnections; and
   the pad open region is further configured to expose the remainder portion of each of the four interconnections.

5. The circuit board of claim 1, wherein:
   each of the plurality of interconnections includes a first portion located in the pad open region, a second portion located in the opening of the second PSR and covered with the first PSR, and a third portion covered with both the first PSR and second PSR; and
   the remainder portion of each of the plurality of interconnections corresponds to the first portion and the portion of each of the plurality of interconnections, covered by the first PSR, correspond to the second portion and the third portion.

6. The circuit board of claim 1,
   wherein the circuit board is a printed circuit board.

7. A displaying apparatus, comprising:
   a circuit board;
   a unit pixel disposed on the circuit board; and
   a molding member covering the unit pixel;
   the circuit board comprising:
      a base having a plurality of interconnections on an upper surface thereof;
      a first photosensitive solder resist (PSR) covering a portion of each of the plurality of interconnection, the first PSR arranged to define a pad open region configured to expose a remainder portion of each of the plurality of interconnections; and
      a second PSR covering the first PSR and having an opening configured to expose the pad open region, wherein:
   the opening of the second PSR is larger than the pad open region of the first PSR, and
   the unit pixel is disposed in the pad open region and in the opening of the second PSR such that the unit pixel is electrically coupled to the remainder portion of each of the plurality of interconnections in the pad open region.

8. The displaying apparatus of claim 7,
wherein the unit pixel includes at least three light emitting devices disposed adjacent to one another.

9. The displaying apparatus of claim 7,
the unit pixel comprising:
a plurality of light emitting stacks stacked one above another; and
a plurality of connection electrodes electrically connected to the plurality of light emitting stacks.

10. The displaying apparatus of claim 7,
wherein the unit pixel is arranged to cover the pad open region.

11. The displaying apparatus of claim 7,
wherein the molding member includes a light absorbing material.

12. The displaying apparatus of claim 7, further comprising:
a display panel; and
a pixel module disposed on the display panel,
wherein the pixel module includes the circuit board and a plurality of unit pixels.

13. A displaying apparatus, comprising:
a panel substrate;
a plurality of pixel modules arranged on the panel substrate, each pixel module comprising:
   a circuit board;
   a plurality of unit pixels disposed on the circuit board; and
   a molding member covering the plurality of unit pixels;
   wherein the circuit board further comprises:
   a base having a plurality of interconnections on an upper surface thereof, wherein an interconnection of the plurality of interconnections comprises a first part, a second part, and a third part;
   a pad open region formed in a first photosensitive solder resist (PSR) layer, the pad open region configured to expose the first part of the interconnection, and the first PSR layer covering the second part and the third part of the interconnection; and
   an opening formed in a second PSR layer covering a portion of the first PSR layer, the pad open region exposed in the opening of the second PSR layer; and
   wherein a unit pixel of the plurality of unit pixels is disposed in the opening such that the unit pixel is electrically connected to the first part of the interconnection in the pad open region.

14. The displaying apparatus of claim 13,
wherein the unit pixel covers the pad open region and includes at least a portion mounted in the opening.

15. The displaying apparatus of claim 13,
wherein the first part of the interconnection is located in the pad open region, the second part located in the opening of the second PSR layer and covered with the first PSR layer, and the third part covered with both the first PSR layer and the second PSR layer.

16. The displaying apparatus of claim 13, wherein the unit pixel further comprises:
a plurality of light emitting stacks stacked one above another on a substrate; and
a plurality of connection electrodes electrically connected to the plurality of light emitting stacks.

17. The displaying apparatus of claim 16, wherein:
the plurality of light emitting stacks is operable to emit light of different peak wavelengths from one another; and
one of the plurality of light emitting stacks, farther from the substrate, emits light of a longer wavelength than another light emitting stack near the substrate.

18. The displaying apparatus of claim 17, wherein an emission area of each of the plurality of light emitting stacks increases as a distance to the substrate decreases.

19. The displaying apparatus of claim 13, wherein:
the unit pixel further comprises a plurality of connection electrodes which is electrically connected to the first part of the interconnection via a bonding material; and
the bonding material is disposed in the pad open region.

\* \* \* \* \*